United States Patent
Kim et al.

(10) Patent No.: US 10,789,186 B2
(45) Date of Patent: Sep. 29, 2020

(54) APPARATUSES AND METHODS INCLUDING MEMORY COMMANDS FOR SEMICONDUCTOR MEMORIES

(71) Applicant: MICRON TECHNOLOGY, INC., Boise, ID (US)

(72) Inventors: Kang-Yong Kim, Boise, ID (US); Dean Gans, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/657,474

(22) Filed: Oct. 18, 2019

(65) Prior Publication Data
US 2020/0050564 A1 Feb. 13, 2020

Related U.S. Application Data

(62) Division of application No. 16/035,452, filed on Jul. 13, 2018, now Pat. No. 10,467,158.

(60) Provisional application No. 62/592,208, filed on Nov. 29, 2017.

(51) Int. Cl.
| G06F 13/16 | (2006.01) |
| G06F 9/30 | (2018.01) |
| G11C 7/22 | (2006.01) |
| G11C 29/02 | (2006.01) |

(52) U.S. Cl.
CPC ...... *G06F 13/1689* (2013.01); *G06F 9/30145* (2013.01); *G11C 7/222* (2013.01); *G11C 29/023* (2013.01); *G11C 29/028* (2013.01)

(58) Field of Classification Search
CPC ............ G06F 13/1689; G06F 9/30145; G11C 29/023; G11C 29/028; G11C 7/222
See application file for complete search history.

(56) References Cited

U.S. PATENT DOCUMENTS

| 5,973,525 | A | 10/1999 | Fujii | |
| 6,337,833 | B1* | 1/2002 | Kanazashi | G11C 7/1051 365/189.05 |
| 2002/0039324 | A1 | 4/2002 | Lee | |
| 2003/0151671 | A1 | 8/2003 | Kubota et al. | |
| 2004/0103226 | A1 | 5/2004 | Johnson et al. | |
| 2004/0215996 | A1* | 10/2004 | Kanamori | G06K 19/077 713/600 |
| 2006/0080565 | A1 | 4/2006 | Hsieh et al. | |
| 2008/0232179 | A1 | 9/2008 | Kwak | |
| 2010/0054059 | A1 | 3/2010 | Yoon et al. | |

(Continued)

*Primary Examiner* — Ernest Unelus
*Assistant Examiner* — Ronald T Modo
(74) *Attorney, Agent, or Firm* — Dorsey & Whitney LLP

(57) ABSTRACT

Apparatuses and methods including memory commands for semiconductor memories are described. A controller provides a memory system with memory commands to access memory. The commands are decoded to provide internal signals and commands for performing operations, such as operations to access the memory array. The memory commands provided for accessing memory may include timing command and access commands. Examples of access commands include a read command and a write command. Timing commands may be used to control the timing of various operations, for example, for a corresponding access command. The timing commands may include opcodes that set various modes of operation during an associated access operation for an access command.

20 Claims, 13 Drawing Sheets

| CMD | CS | CA0 | CA1 | CA2 | CA3 | CA4 | CA5 | CA6 | CK | |
|---|---|---|---|---|---|---|---|---|---|---|
| CAS | H | L | L | H | H | WS_WR | WS_RD | WS_FS | R1 | |
| | X | DC0 | DC1 | DC2 | DC3 | V | WRX | B3 | F1 | WS_FS=0 |
| | | WCKon_OTF | | WCKENL_OTF | | | WRX | B3 | F1 | WS_FS=1 |

1000

(56) References Cited

U.S. PATENT DOCUMENTS

| | | |
|---|---|---|
| 2010/0182856 A1 | 7/2010 | Koshizuka |
| 2010/0195421 A1 | 8/2010 | Jeddeloh |
| 2012/0113729 A1 | 5/2012 | Mochizuki |
| 2012/0268655 A1 | 10/2012 | Macinnis et al. |
| 2014/0266320 A1 | 9/2014 | Conrow et al. |
| 2014/0293727 A1 | 10/2014 | Nakamura et al. |
| 2015/0317096 A1 | 11/2015 | Bains |
| 2015/0340072 A1 | 11/2015 | Mazumder |
| 2016/0118094 A1 | 4/2016 | Hyun et al. |
| 2017/0110173 A1 | 4/2017 | Matsuno et al. |
| 2019/0102109 A1 | 4/2019 | Kim et al. |
| 2019/0163652 A1 | 5/2019 | Kim et al. |
| 2019/0265913 A1 | 8/2019 | Kim et al. |

\* cited by examiner

| CMD | CS | CA0 | CA1 | CA2 | CA3 | CA4 | CA5 | CA6 | CK | |
|---|---|---|---|---|---|---|---|---|---|---|
| CAS | H | L | L | H | H | WS_WR | WS_RD | WS_FS | R1 | |
| | X | DC0 | DC1 | DC2 | DC3 | V | WRX | B3 | F1 | WS_FS=0 |
| | | DC0 | DC1 | WCKENL_OTF | | | WRX | B3 | F1 | WS_FS=1 |

FIG. 6A

| WCKENL_OTF | CA4 | CA3 | C24 |
|---|---|---|---|
| 0 | 0 | 0 | 0 |
| 1 tCK | 1 | 0 | 0 |
| 2 tCK | 0 | 1 | 0 |
| 3 tCK | 1 | 1 | 0 |
| 4 tCK | 0 | 0 | 1 |
| 6 tCK | 1 | 0 | 1 |
| 8 tCK | 0 | 1 | 1 |
| 11 tCK | 1 | 1 | 1 |

FIG. 6B

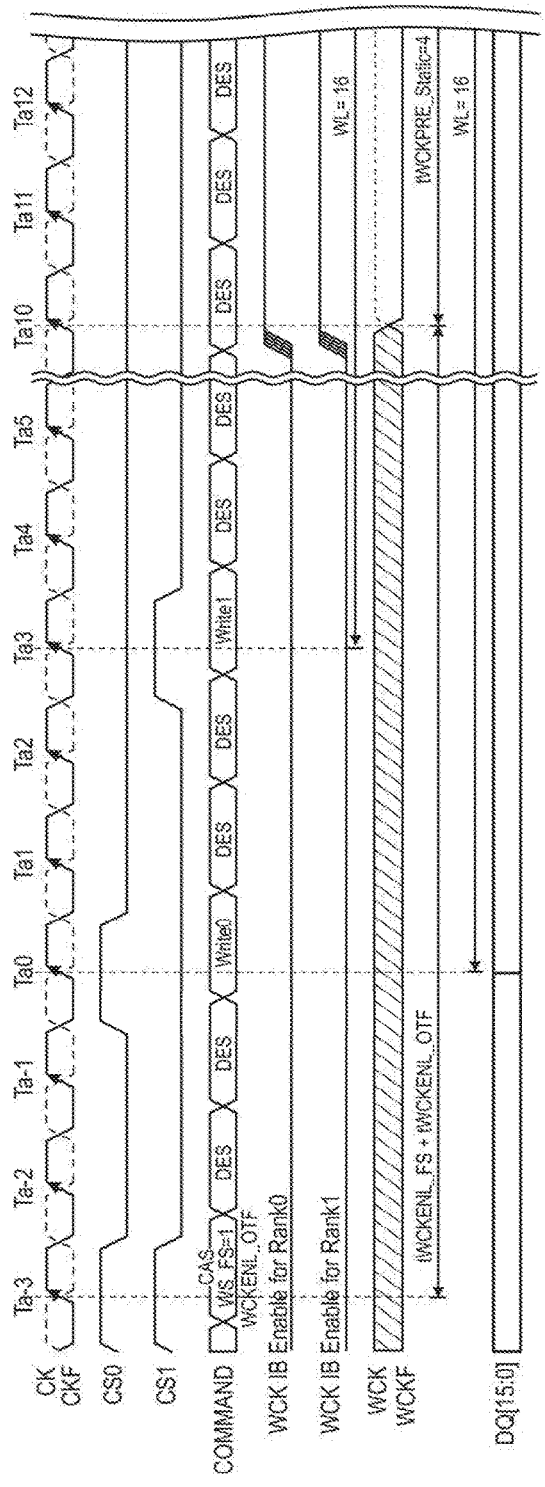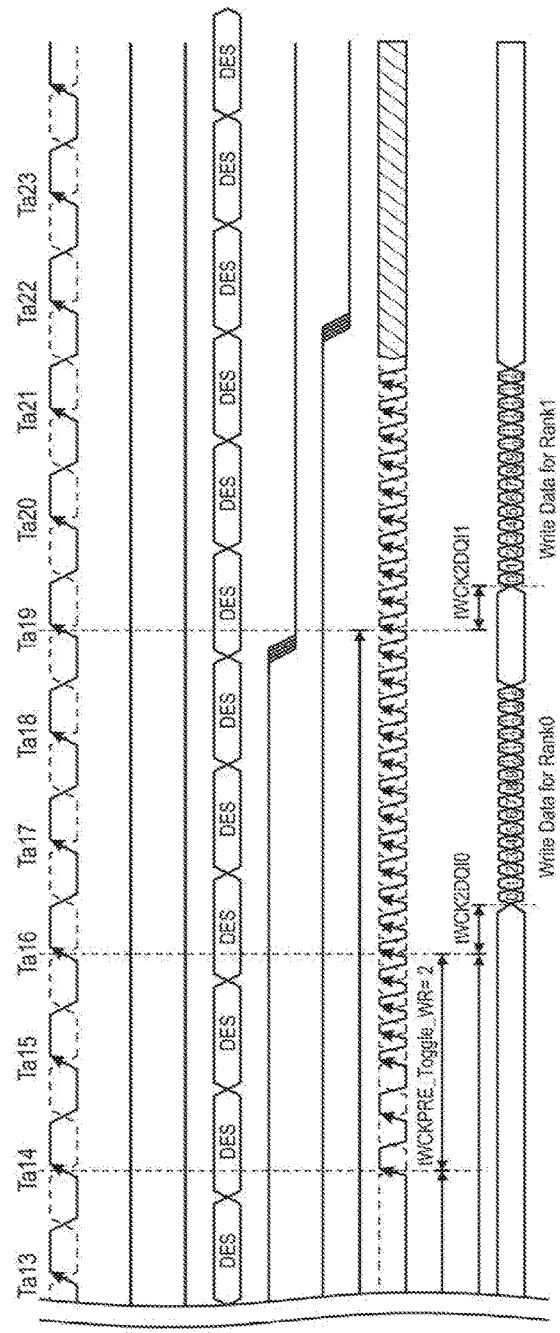
FIG. 9-1
FIG. 9-2

| CMD | CS | CA0 | CA1 | CA2 | CA3 | CA4 | CA5 | CA6 | CK |
|---|---|---|---|---|---|---|---|---|---|
| CAS | H | L | L | H | H | WS_WR | WS_RD | WS_FS | R1 |
|  | X | DC0 | DC1 | DC2 | DC3 | V | WRX | B3 | F1 (WS_FS=0) |
|  |  |  |  |  |  |  | WRX | B3 | F1 (WS_FS=1) |

WCKon_OTF ← → WCKENL_OTF   1000

FIG. 10A

| CA1 | CA0 | WCKon_OTF (CMD count) |
|---|---|---|
| 0 | 0 | A single RD or WR |
| 0 | 1 | 2 RDs or WRs |
| 1 | 0 | 4 RDs or WRs |
| 1 | 1 | 8 RDs or WRs |

FIG. 10B

| CA1 | CA0 | Additional WCKon_OTF (CLK count) |
|---|---|---|
| 0 | 0 | 0 tCK |
| 0 | 1 | 4 tCK |
| 1 | 0 | 8 tCK |
| 1 | 1 | 16 tCK |

FIG. 10C

APPARATUSES AND METHODS INCLUDING MEMORY COMMANDS FOR SEMICONDUCTOR MEMORIES

CROSS-REFERENCE TO RELATED APPLICATIONS

This application is a divisional of U.S. patent application Ser. No. 16/035,452, filed Jul. 13, 2018 which claims the filing benefit of U.S. Provisional Application No. 62/592,208, filed Nov. 29, 2017. These applications are incorporated by reference herein in their entirety and for all purposes.

BACKGROUND

Semiconductor memories are used in many electronic systems to store data that may be retrieved at a later time. As demand has increased for electronic systems to be faster, have greater memory capacity, and consume less power, semiconductor memories that may be accessed faster, store more data, and use less power have been continually developed to meet the changing needs. Part of the development includes creating new specifications for controlling and accessing semiconductor memories, with the changes in the specifications from one generation to the next directed to improving performance of the memories in the electronic systems.

Semiconductor memories are generally controlled by providing the memories with command signals, address signals, clock signals. The various signals may be provided by a memory controller, for example. The command signals may control the semiconductor memories to perform various memory operations at memory locations corresponding to the address signals, for example, a read operation to retrieve data from a memory, and a write operation to store data to the memory. The data may be provided between the controller and memories with known timing relative to receipt of the associated command by the memory. The known timing is typically defined by latency information. The latency information may be defined in terms of numbers of clock cycles of system clock signals CK and CKF.

With newly developed memories, the memories may be provided with system clock signals that are used for timing command signals and address signals, for example, and further provided with data clock signals that are used for timing read data provided by the memory and for timing write data provided to the memory. The memories may also provide clock signals to the controller for timing data provided to the controller.

The timing of various memory commands provided by the controller and received by the memories may be used to control performance of the memories, including the timing of when clock signals are provided, when data is provided or received, etc. Limitations on the timing of the various memory commands relative to one another may result in less desirable performance by the memories. As such, it may be desirable to have memory commands with flexible timing to provide desirable memory performance.

BRIEF DESCRIPTION OF THE DRAWINGS

FIG. 6A is a diagram of a command structure for a timing command according to an embodiment of the disclosure.

FIG. 6B is a diagram of opcodes for a fast clock signal synchronization option according to an embodiment of the disclosure.

FIG. 9 (including FIGS. 9-1 and 9-2) is a timing diagram for rank-to-rank write operations with clock signal synchronization according to an embodiment of the disclosure.

FIG. 10A is a diagram of a command structure for a timing command according to an embodiment of the disclosure.

FIG. 10B is a diagram of opcodes for a fast clock signal synchronization option according to an embodiment of the disclosure.

FIG. 10C is a diagram of opcodes for a fast clock signal synchronization option according to an embodiment of the disclosure.

DETAILED DESCRIPTION

Certain details are set forth below to provide a sufficient understanding of examples of the disclosure. However, it will be clear to one having skill in the an that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the disclosure. Additionally, terms such as "couples" and "coupled" mean that two components may be directly or indirectly electrically coupled. Indirectly coupled may imply that two components are coupled through one or more intermediate components.

Figure 1:
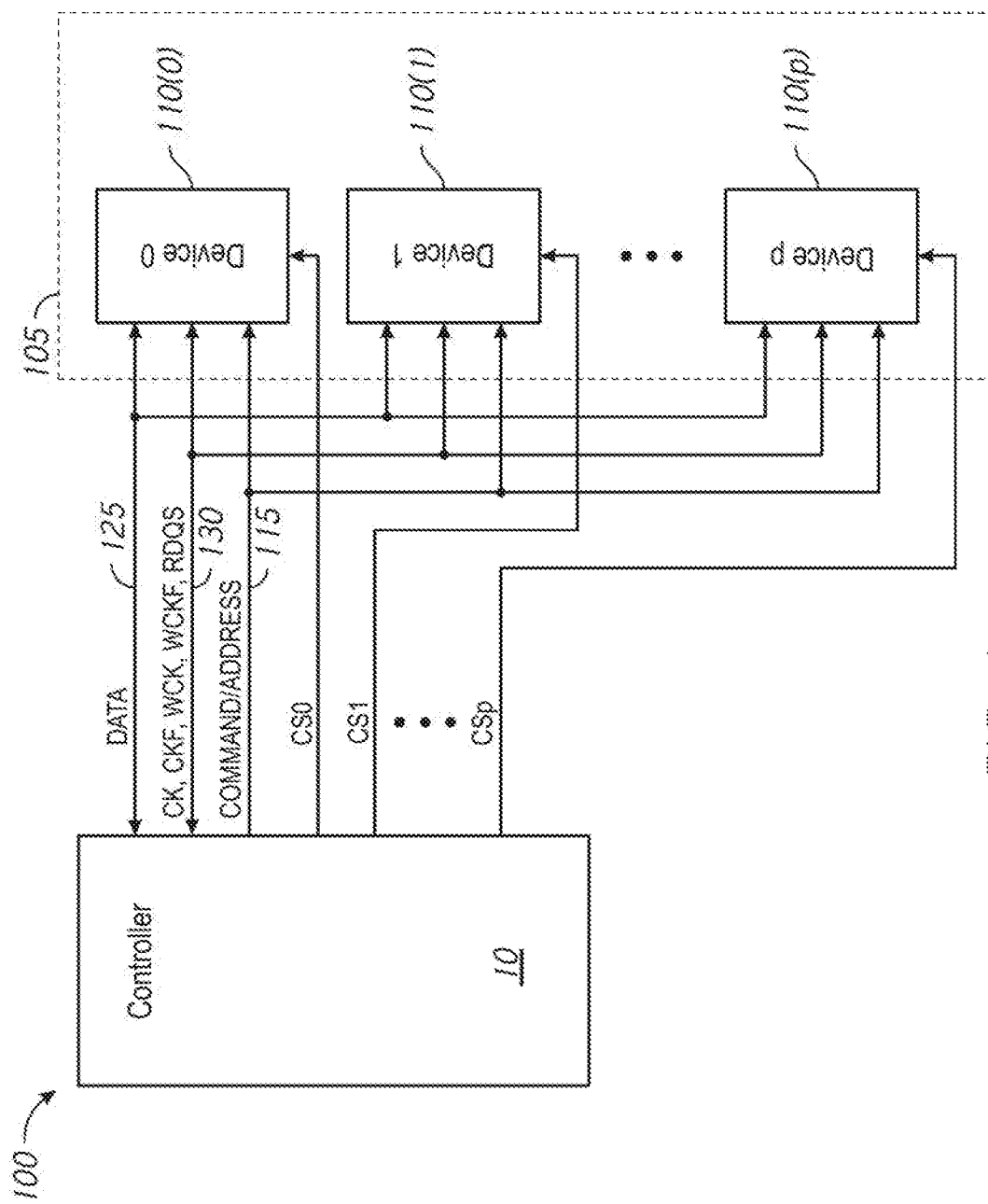
FIG. 1 is a block diagram of a system according to an embodiment of the disclosure.

FIG. 1 is a block diagram of a system 100 according to an embodiment of the disclosure. The system 100 includes a controller 10 and a memory system 105. The memory system 105 includes memories 110(0)-110(p) (e.g., "Device0" through "Devicep"), where p is a non-zero whole number. The memories 110 may be dynamic random access memory (DRAM), such as low power double data rate (LPDDR) DRAM in some embodiments of the disclosure. The memories 110(0)-110(p) are each coupled to the command/address, data, and clock busses. In some embodiments of the disclosure the memories 110(0)-110(p) are organized as ranks of memory. In such embodiments, the memories may be accessed by the ranks of memory. The controller 10 and the memory system 105 are in communication over several busses. For example, commands and addresses are received by the memory system 105 on a command/address bus 115, and data is provided between the controller 10 and the memory system 105 over a data bus 125. Various clock signals may be provided between the controller and memory system 105 over a clock bus 130. The clock bus 130 may include signal lines for providing system clock signals CK and CKF received by the memory system 105, data clock signals WCK and WCKF received by the memory system 105, and an access data clock signal RDQS provided by the memory system 105 to the controller 10. Each of the busses may include one or more signal lines on which signals are provided.

The CK and CKF signals provided by the controller 10 to the memory system 105 are used for timing the provision and receipt of the commands and addresses. The WCK and WCKF signals and the RDQS signal are used for timing the provision of data. The CK and CKF signals are complementary and the WCK and WCKF signals are complementary. Clock signals are complementary when a rising edge of a first clock signal occurs at the same time as a falling edge of a second clock signal, and when a rising edge of the second clock signal occurs at the same time as a falling edge of the first clock signal. The WCK and WCKF signals provided by the controller 10 to the memory system 105 may be synchronized to the CK and CKF signals also provided by the controller 10 to the memory system 105. Additionally, the WCK and WCKF signals may have a higher clock frequency than the CK and CKF signals. For example, in some embodiments of the disclosure, the WCK and WCKF signals have a clock frequency that is four times the clock frequency of the CK and CKF signals. The WCK and WCKF signals may be provided by the controller 10 to the memory system 105 continuously during access operations (e.g., WCK always on option enabled) to improve timing performance for the access operations. However, continuously providing the WCK and WCKF signals increases power consumption by the system. Where power consumption may be of concern, the controller 10 does not provide the WCK and WCKF signals continuously (e.g., WCK always on option disabled). For example, the controller provides the WCK and WCKF signals when needed for an access operation. The WCK and WCKF signals are provided to the memory at a time that maybe defined by a specification, for example, to provide sufficient time for internal clock signals to generate based on the WCK and WCKF signals.

The controller 10 provides commands to the memory system 105 to perform memory operations. Non-limiting examples of memory commands include timing commands for controlling the timing of various operations, access commands for accessing the memory, such as read commands for performing read operations and write commands for performing write operations, mode register write and read commands for performing mode register write and read operations, as well as other commands and operations. The command signals provided by the controller 10 to the memory system 105 further include select signals (e.g., chip select CS signals CS0, CS1, CSp). While all of the memories 110 are provided the commands, addresses, data, and clock signals, the select signals provided on respective select signal lines are used to select which of the memories 110 will respond to the command and perform the corresponding operation. In some embodiments of the disclosure, a respective select signal is provided to each memory 110 of the memory system 105. The controller 10 provides an active select signal to select the corresponding memory 110. While the respective select signal is active, the corresponding memory 100 is selected to receive the commands and addresses provided on time command/address bus 115.

In operation, when a read command and associated address are provided by the controller 10 to the memory system 105, the memory 110 selected by the select signals receives the read command and associated address, and performs a read operation to provide the controller 10 with read data from a memory location corresponding to the associated address. The read data is provided by the selected memory 110 to the controller 10 according to a timing relative to receipt of the read command. For example, the timing may be based on a read latency (RL) value that indicates the number of clock cycles of the CK and CKF signals (a clock cycle of the CK and CKF signals is referenced as tCK) after the read command when the read data is provided by the selected memory 110 to the controller 10. The RL value is programmed by the controller 10 in the memories 110. For example, the RL value may be programmed in respective mode registers of the memories 110. As known, mode registers included in each of the memories 110 may be programmed with information for setting various operating modes and/or to select features for operation of the memories. One of the settings may be for the RL value.

In preparation of the selected memory 110 providing the read data to the controller 10, the controller provides active WCK and WCKF signals to the memory system 105. The WCK and WCKF signals may be used by the selected memory 110 to generate an access data clock signal RDQS. A clock signal is active when the clock signal transitions between low and high clock levels periodically. Conversely, a clock signal is inactive when the clock signal maintains a constant clock level and does not transition periodically. The RDQS signal is provided by the memory 110 performing the read operation to the controller 10 for timing the provision of read data to the controller 10.

The controller 10 may use the RDQS signal for receiving the read data. In some embodiments of the disclosure, the controller 10 has two modes for using the RDQS signal for receiving the read data. In a first mode, the controller 10 may use the RDQS signal to control the timing of circuitry for capturing the read data from the selected memory 110. In a second mode, the controller 10 may recover a clock timing from the RDQS signal and generate an internal timing signal based on the recovered timing. The internal timing signal may then be used by the controller 10 to control the timing of circuitry for capturing the read data from the selected memory 110.

The controller 10 provides information to the memory system 105 (e.g., in a command) to indicate which of the modes the RDQS signal will be used by the controller 10. The memory system 105 provides the RDQS signal to the controller 10 with different timing depending on the mode indicated by the controller 10. For example, as will be described in more detail below, the RDQS signal may be provided to the controller 10 with a first timing for the first mode, and provided to the controller 10 with a second timing for the second mode, where the second timing is relatively earlier (e.g., sooner) in comparison to the first mode. The earlier timing of the memory system 105 providing the RDQS signal to the controller 10 may allow greater time for the controller 10 to recover the clock timing from the RDQS signal before the data is provided by the memory system 105 in order to meet the data timing as established by the read latency value RL.

In operation, when a write command and associated address are provided by the controller 10 to the memory system 105, the memory 110 selected by the select signals receives the write command and associated address, and performs a write operation to write data from the controller 10 to a memory location corresponding to the associated address. The write data is provided to the selected memory 110 by the controller 10 according to a timing relative to receipt of the write command. For example, the timing may be based on a write latency (WL) value that indicates the number of clock cycles of the CK and CKF signals after the write command when the write data is provided to the selected memory 110 by the controller 10. The WL value is programmed by the controller 10 in the memories 110. For example, the WL value may be programmed in respective mode registers of the memories 110.

In preparation of the selected memory 110 receiving the write data from the controller 10, the controller provides active WCK and WCKF signals to the memory system 105. The WCK and WCKF signals may be used by the selected memory 110 to generate internal clock signals for timing the operation of circuits to receive the write data. The data is provided by the controller 10 and the selected memory 110 receives the write data according to the WCK and WCKF signals, which is written to memory corresponding to the memory addresses.

Figure 2:
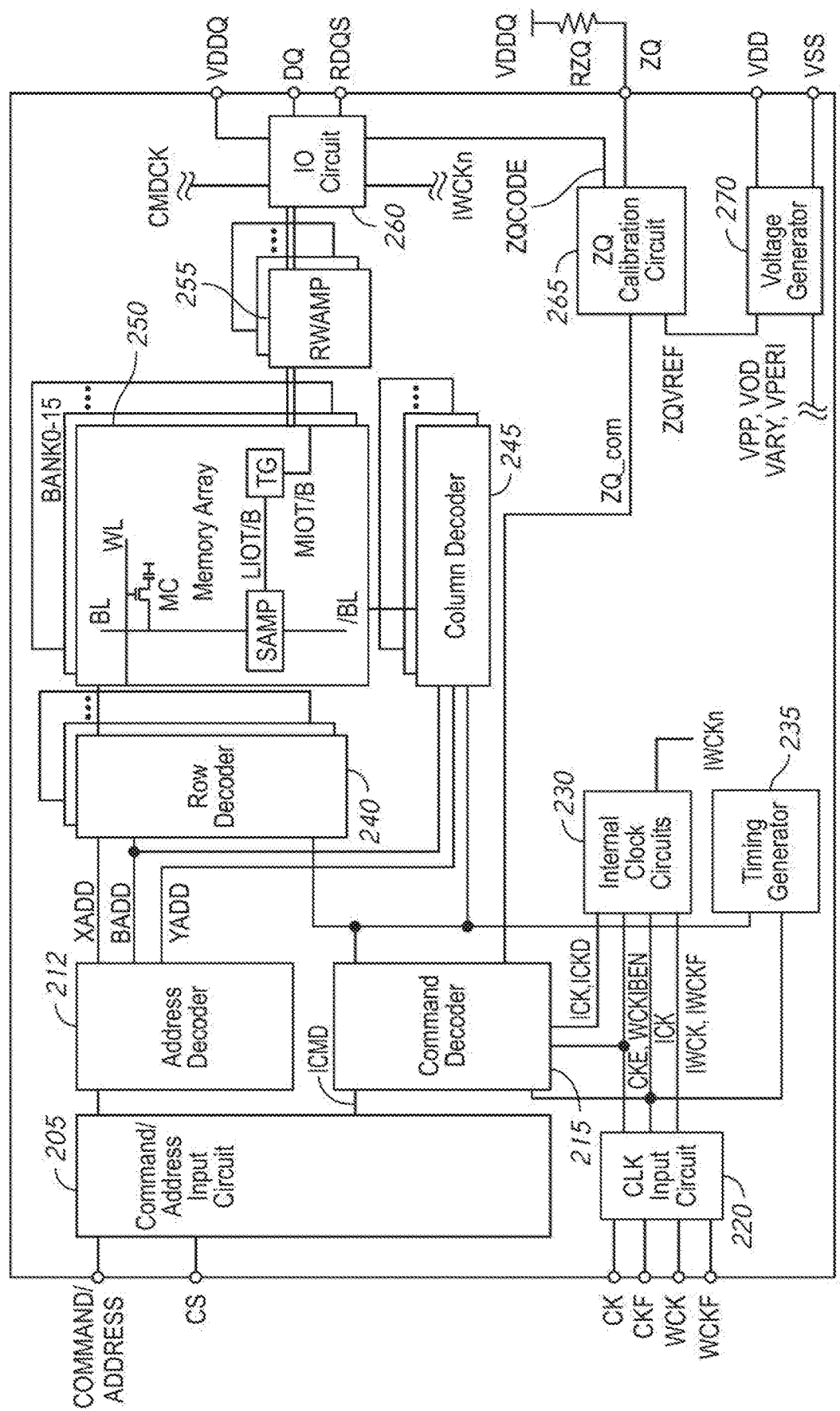
FIG. 2 is a block diagram of an apparatus according to an embodiment of the disclosure.

FIG. 2 is a block diagram of an apparatus according to an embodiment of the disclosure. The apparatus may be a semiconductor device 200, and will be referred as such. In some embodiments, the semiconductor device 200 may include, without limitation, a memory, such as a LPDDR memory integrated into a single semiconductor die, for example. In some embodiments of the disclosure, the semiconductor die may include only semiconductor device 200. In some embodiments of the disclosure, the semiconductor die may include the semiconductor device 200 embedded with other systems integrated on the same semiconductor die. The semiconductor device 200 may be included in the memory system 205 of FIG. 2 in some embodiments of the disclosure. For example, each of the memories 110 may include a semiconductor device 200. The semiconductor device 200 may include a memory array 250. The memory array 250 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 240 and the selection of the bit line BL is performed by a column decoder 245. Sense amplifiers (SAMP) are located for their corresponding bit lines BL and connected to at least one respective local I/O line pair (LIOT/B), which is in turn coupled to at least respective one main I/O line pair (MIOT/B), via transfer gates (TG), which function as switches.

The semiconductor device 200 may employ a plurality of external terminals that include command/address terminals coupled to a command address bus to receive command signals COMMAND and address signals ADDRESS, clock terminals to receive clock signals CK and CKF, data clock terminals to receive data clock signals WCK and WCKF, data terminals DQ and RDQS, power supply terminals VDD, VSS, and VDDQ, and the ZQ calibration terminal (ZQ).

The command/address terminals may be supplied with an address signal and a bank address signal. The address signal and the bank address signal supplied to the command/address terminals are transferred, via a command/address input circuit 205, to an address decoder 212. The address decoder 212 receives the address signals and supplies a decoded row address signal XADD to the row decoder 240, and a decoded column address signal YADD to the column decoder 245. The address decoder 212 also receives the bank address signal and supplies the bank address signal BADD to the row decoder 240, the column decoder 245.

The command/address terminals may further be supplied with command signals COMMAND from, for example, a memory controller. The command signals COMMAND may be provided as internal command signals ICMD to a command decoder 215 via the command/address input circuit 205. The command decoder 215 includes circuits to decode the internal command signals ICMD to generate various internal signals and commands for performing operations, for example, internal signals to control the circuits of the semiconductor device 200 to access the memory array 250 based on the command signals, such as to read data from or write data to the memory array 250 based on a read command or a write command, respectively. Another example may be providing internal signals to enable circuits for performing operations, such as control signals to enable signal input buffers that receive clock signals.

When a read command is issued and a row address and a column address are timely supplied with the read command, read data is read from a memory cell in the memory array 250 designated by these row address and column address. The read command is received by the command decoder 215, which provides internal commands to input output circuit 260 so that read data is output to outside from the data terminals DQ via read/write amplifiers 255 and the input/output circuit 260 according to the RDQS clock signals. As previously described, the read data is provided at a time defined by read latency information RL that may be programmed in the semiconductor device, for example, in a mode register (not shown in FIG. 2). The read latency information RL may be defined in terms of clock cycles of the CK signal. For example, the read latency information RL may be a number of clock cycles of the CK signal after the read command is received by the semiconductor device 200 when the associated read data is provided.

When the write command is issued and a row address and a column address are timely supplied with this command, then write data is supplied to the data terminals DQ according to the WCK and WCKF signals. The write command is received by the command decoder 215, which provides internal commands to the input/output circuit 260 so that the write data is received by data receivers in the input/output circuit 260, and supplied via the input/output circuit 260 and the read/write amplifiers 255 to the memory array 250. The write data is written in the memory cell designated by the row address and the column address. As previously described, the write data is provided to the data terminals DQ at a time that is defined by write latency WL information. The write latency WL information may be programmed in the semiconductor device 200, for example, in the mode register (not show n in FIG. 2). The write latency WL information may be defined in terms of clock cycles of the CK signal. For example, the write latency information WL may be a number of clock cycles of the CK signal after the write command is received by the semiconductor device 200 when the associated write data is provided to the data terminals DQ.

The clock terminals and data clock terminals are supplied with external clock signals. The external clock signals CK, CKF, WCK, WCKF may be supplied to a clock input circuit 220. The CK and CKF signals may be complementary and the WCK and WCKF signals may be complementary. When enabled, input buffers included in the clock input circuit 220 receive the external clock signals. For example, an input buffer receives the CK and CKF signals when enabled by a CKE signal from the command decoder 215 and an input buffer receives the WCK and WCKF signals when enabled by a WCKIBEN signal from the command decoder 215. The clock input circuit 220 may receive the external clock signals to generate internal clock signals ICK and IWCK and IWCKF. The internal clock signals ICK and IWCK and IWCKF are supplied to internal clock circuits 230.

The internal clock circuits 230 includes circuits that provide various phase and frequency controlled internal clock signals based on the received internal clock signals. For example, the internal clock circuits 230 may include a clock path (not shown in FIG. 2) that receives the ICK signal and provides internal clock signals ICK and ICKD to the command decoder 215. The internal clock circuits 230 may further include a data clock path that receives the IWCK and IWCKF signals and provides multiphase clock signals IWCKn based on the internal clock signals IWCK and IWCKF. As will be described in more detail below, the multiphase clock signals IWCKn have relative phases with each other and have a phase relationship with the WCK and WCKF signals. A clock signal synchronization circuit included in the internal clock circuits 230 performs WCK-CK synchronization to determine the phase relationship between the IWCKn signals and the WCK and WCKF signals, and change the phase relationship between the IWCKn signals and the WCK and WCKF signals, if necessary, to a phase relationship that provides proper operation of the semiconductor device 200. When the IWCKn and WCK and WCKF signals have that phase relationship, WCK-CK synchronization is complete.

The multiphase clock signals IWCKn may also be provided to the input/output circuit 260 for controlling an output timing of read data and the input timing of write data. The input/output circuit 160 may include clock circuits and driver circuits for generating and providing the RDQS signal. The data clock path may also provide a delayed multiphase clock signal IWCKD, which is one of the multiphase clock signals IWCKn further delayed.

The power supply terminals are supplied with power supply potentials VDD and VSS. These power supply potentials VDD and VSS are supplied to an internal voltage generator circuit 270. The internal voltage generator circuit 270 generates various internal potentials VPP, VOD, VARY, VPERI, and the like and a reference potential ZQVREF based on the power supply potentials VDD and VSS. The internal potential VPP is mainly used in the row decoder 240, the internal potentials VOD and VARY are mainly used in the sense amplifiers included in the memory array 250, and the internal potential VPERI is used in many other circuit blocks. The reference potential ZQVREF is used in the ZQ calibration circuit 265.

The power supply terminal is also supplied with power supply potential VDDQ. The power supply potentials VDDQ is supplied to the input output circuit 260 together with the power supply potential VSS. The power supply potential VDDQ may be the same potential as the power supply potential VDD in an embodiment of the disclosure. The power supply potential VDDQ may be a different potential from the power supply potential VDD in another embodiment of the disclosure. However, the dedicated power supply potential VDDQ is used for the input/output circuit 260 so that power supply noise generated by the input/output circuit 260 does not propagate to the other circuit blocks.

The calibration terminal ZQ is connected to the ZQ calibration circuit 265. The ZQ calibration circuit 265 performs a calibration operation with reference to an impedance of RZQ, and the reference potential ZQVREF, when activated by the ZQ calibration command ZQ_com. An impedance code ZQCODE obtained by the calibration operation is supplied to the input/output circuit 260, and thus an impedance of an output buffer (not shown) included in the input/output circuit 260 is specified.

Figure 3:
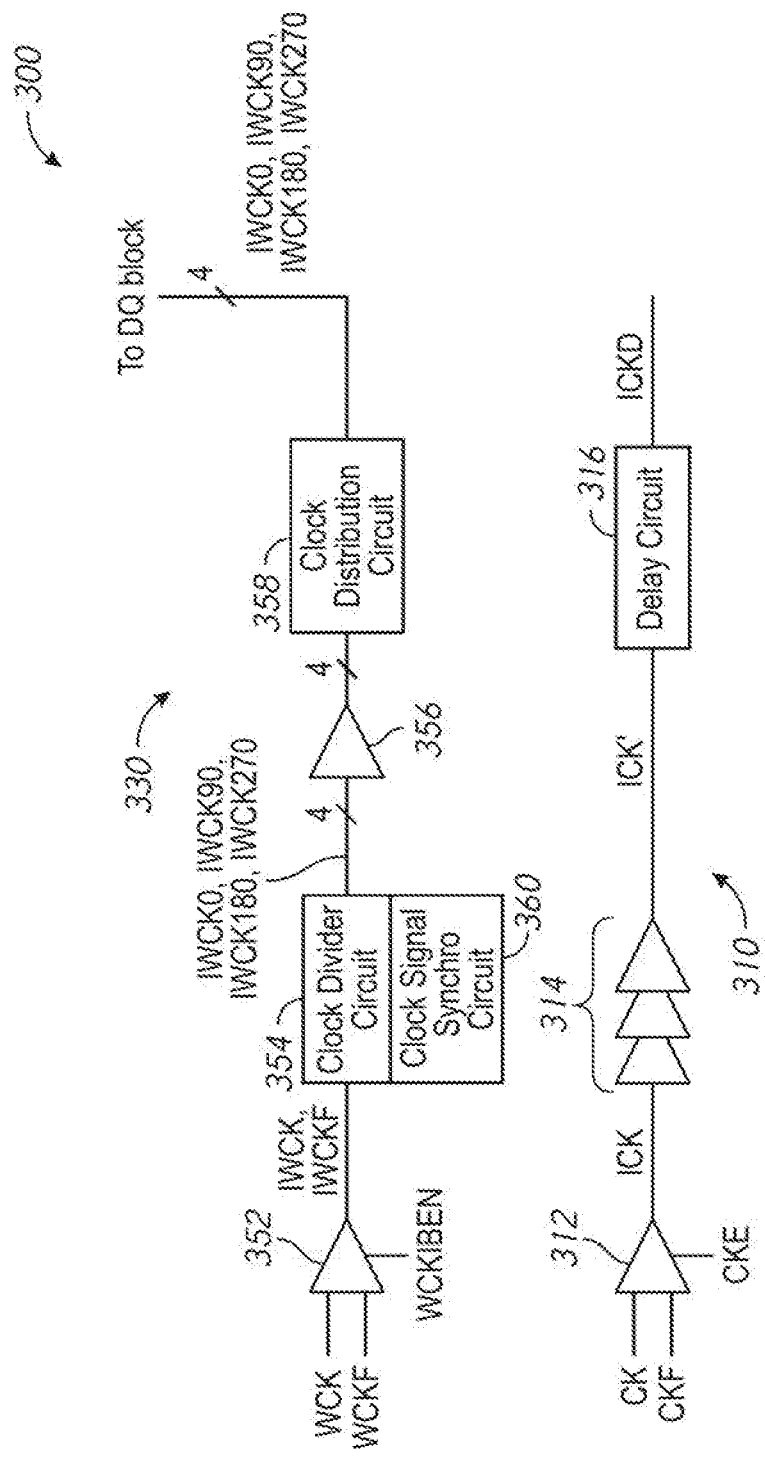
FIG. 3 is a block diagram of a clock path and a data clock path according to an embodiment of the disclosure.

FIG. 3 is a block diagram of a clock path 310 and a data clock path 330 according to an embodiment of the disclosure. The clock path 310 and data clock path 330 may be included in the semiconductor device 200 of FIG. 2 in some embodiments of the disclosure. For example, portions of the data clock path 330 may be included in the clock input circuit 220 and/or the internal clock circuit 230 of the semiconductor device 200 of FIG. 2. One or both of the clock path 310 and the data clock path 330 may be modified without departing from the scope of the present disclosure.

The clock path 310 may include an input buffer 312. When enabled by an active enable signal CKE (e.g., active high logic level) the input buffer 312 receives complementary clock signals CK and CKF and provides an internal clock signal ICK. The input buffer 312 may be included in the clock input circuit 220 of FIG. 2. The internal clock signal ICK is based on the CK and CKF signals. Repeater circuits 314 receive the ICK signal and provide an ICK' signal to a delay circuit 316. The repeater circuits 314 drive the ICK signal over a clock line from the input buffer 312 to the delay circuit 316. The ICK' signal is delayed by the delay circuit 316 to provide a delayed ICK clock signal ICKD. The ICK' and ICKD signals may be used by a command path (not shown) for timing the decoding and provision of internal command signals to perform memory operations (e.g., read, write, etc.).

The data clock path 330 includes an input buffer 352. When enabled by an active enable signal WCKIBEN (e.g., active high logic level), the input buffer 352 receives complementary clock signals WCK and WCKF and provides the complementary internal clock signals IWCK and IWCKF based on the WCK and WCKF signals. The receiver circuit 352 may be enabled, for example, by a command decoder responsive to a memory command. In an embodiment of the disclosure, the IWCK and IWCKF signals have the same clock frequency as the WCK and WCKF signals, and the IWCK signal corresponds to the WCK signal and the IWCKF signal corresponds to the WCKF signal. The input buffer 352 may be included in the clock input circuit 220 of FIG. 2.

The IWCK and IWCKF signals are provided to a clock divider circuit 354 that is configured to provide multiphase clock signals IWCK0, IWCK90, IWCK180, IWCK270 (collectively referred to as the multiphase clock signals IWCKn). The multiphase clock signals IWCKn have relative phases to one another, and have a clock frequency that is less than the clock frequency of the WCK and WCKF signals (and the IWCK and IWCKF signals). In an embodiment of the disclosure, the IWCK0, IWCK90, IWCK180, and IWCK270 signals have a clock frequency that is one-half the clock frequency of the WCK and WCKF signals.

In an embodiment of the disclosure, the IWCK0, IWCK90, IWCK180, and IWCK270 signals have a relative phase of 90 degrees to one another. For example, the IWCK90 signal has a phase of 90 degrees relative to the IWCK0 signal, the IWCK180 signal has a phase of 90 degrees relative to the IWCK90 signal (and a phase of 180 degrees relative to the IWCK0 signal), and the IWCK270 signal has a phase of 90 degrees relative to the IWCK180 signal (and a phase of 270 degrees relative to the IWCK0 signal). In such a case, the multiphase clock signals IWCK0, IWCK90, IWCK180, and IWCK270 may be referred to as "quadrature" phase clock signals.

The multiphase clock signals are provided to repeater circuits 356. The repeater circuits 356 include a repeater circuit for each of the multiphase clock signals IWCKn. The repeater circuits 356 drive the multiphase clock signals IWCKn over clock lines from the clock divider circuit 354 to a clock distribution circuit 358. The clock distribution circuit 358 provides the multiphase clock signals IWCKn to various circuitries that operate according to the multiphase clock signals. For example, the multiphase clock signals IWCKn may be provided to clock input/output circuits to provide and receive data according to the timing of the IWCKn signals (referenced in FIG. 3 as "To DQ block").

A clock signal synchronization circuit 360 performs WCK-CK synchronization to determine the phase relationship between the IWCKn signals and the WCK and WCKF signals, and change the phase relationship between the IWCKn signals and the WCK and WCKF signals, if necessary, to a phase relationship that provides proper operation of the semiconductor device 200.

As previously described, the IWCK0, IWCK90, IWCK180, and IWCK270 signals provided by the clock divider circuit 354 are based on the IWCK and IWCKF signals. The IWCK0, IWCK90, IWCK180, IWCK270 signals may have a phase relationship relative to the IWCK and IWCKF signals, and likewise, with the WCK and WCKF signals (from which the IWCK and IWCKF signals are based). For example, the multiphase clock signals IWCK0, IWCK90, IWCK180, and IWCK270 provided by the clock divider circuit 354 may have one of two phase relationships relative to the WCK and WCKF signals. A first phase relationship and a second phase relationship are illustrated in FIG. 4.

In the first phase relationship, a rising edge 420 of the IWCK0 signal is associated with a first rising edge 410 of the IWCK signal (and the WCK signal, not shown in FIG. 4) and a first rising edge of the CK signal, a rising edge 422 of the IWCK90 signal is associated with a first falling edge 412 of the IWCK signal, a rising edge 424 of the IWCK180 signal is associated with a second rising edge 414 of the IWCK signal and a first falling edge of the CK signal, and a rising edge 426 of the IWCK270 signal is associated with a second falling edge 416 of the IWCK signal. The first phase relationship may be referred to as an "in order" phase relationship.

In the second phase relationship, a falling edge 430 of the IWCK0 signal is associated with the first rising edge 410 of the IWCK signal (and the WCK signal) and a first rising edge of the CK signal, a falling edge 432 of the IWCK90 signal is associated with the first falling edge 412 of the IWCK signal, a falling edge 434 of the IWCK180 signal is associated with the second rising edge 414 of the IWCK signal and a first falling edge of the CK signal, and a falling edge 436 of the IWCK270 signal is associated with the second falling edge 416 of the IWCK signal. The second phase relationship may be referred to as an "out of order" phase relationship.

Figure 4:
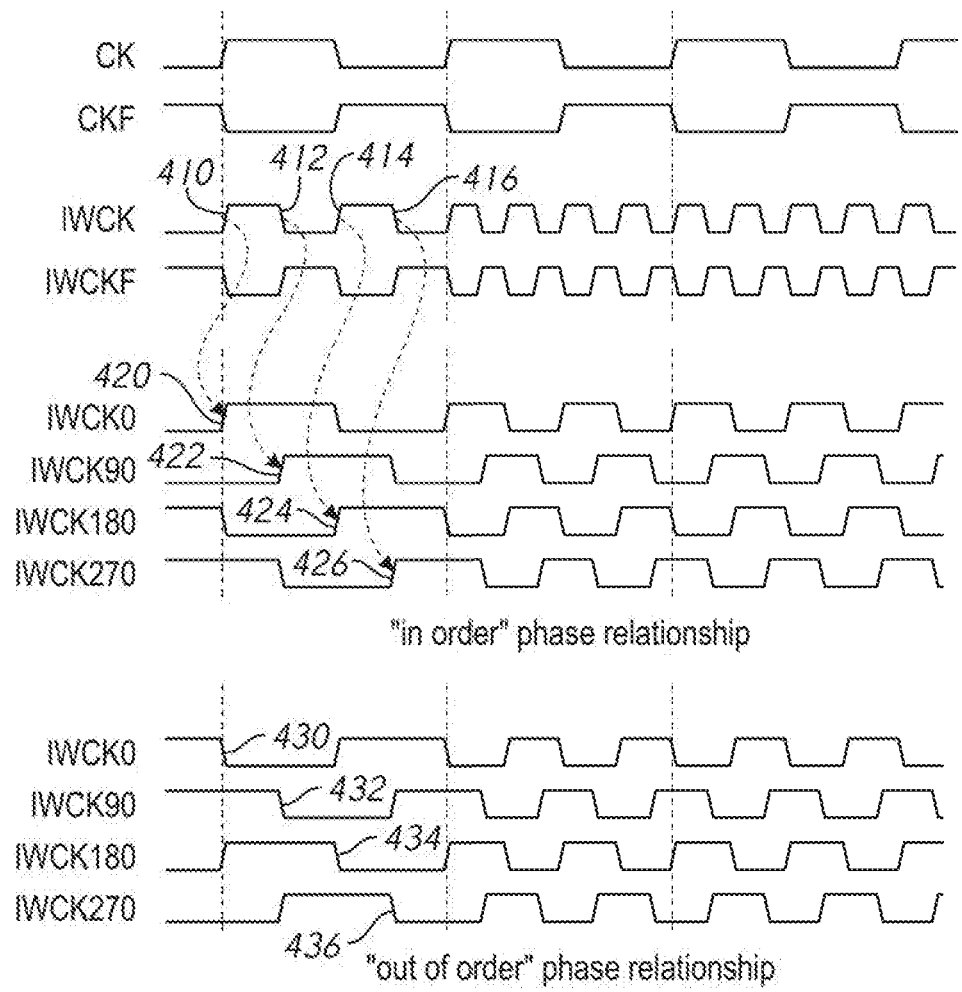
FIG. 4 is a timing diagram showing a first phase relationship and a second phase relationship between clock signals according to an embodiment of the disclosure.

The first and second phase relationships are maintained even when a clock frequency of the WCK and WCKF (and IWCK and IWCKF) signals changes, for example, the clock frequency increases, as shown in FIG. 4 following the falling edge 416 of the IWCK signal.

The phase relationship of the multiphase clock signals IWCKn provided by the clock divider circuit 254 may not be known until a determination is made. The phase relationship of the multiphase clock signals IWCKn may be determined, for example, during a WCK-CK synchronization process, which is described in more detail below.

The clock signal synchronization circuit performs WCK-CK synchronization to determine the phase relationship of the multiphase clock signals IWCKn to the WCK and WCKF signals. Determining the phase relationship of the multiphase clock signals IWCKn to the WCK and WCKF signals may be needed because proper operation of the semiconductor device 200 may be based on the multiphase clock signals having one of the phase relationships. For example, read data may be provided by the semiconductor device 200 properly when the multiphase clock signals have the "in order" phase relationship and the IWCK0 signal is synchronized with the WCK signal. In such an example, when it is determined that the multiphase clock signals IWCKn have the "out of order" phase relationship, the clock signal synchronization circuit 360 changes various ones of the multiphase clock signals to provide "in order" multiphase clock signals to synchronize the IWCK0 signal with the WCK signal. As an example, the IWCK180 signal and the IWCK0 signal of the out of order multiphase clock signals may be switched and the IWCK270 signal and the IWCK90 signal of the out of order multiphase clock signals may be switched. As a result, the "out of order" multiphase clock signals are switched into "in order" multiphase clock signals.

By determining the phase relationship between the multiphase clock signals IWCKn and the WCK and WCKF signals, the relationship between the multiphase clock signals IWCKn and the CK and CKF signals may be determined. If necessary, the clock signal synchronization circuit 360 changes the phase relationship between the IWCKn and the WCK and WCKF signals to provide the "in order" phase relationship. As a result, the IWCK0 signal is synchronized with the WCK signal, which also synchronizes the IWCK0 signal with the CK signal. In some embodiments of the disclosure, WCK-CK synchronization may be completed when the IWCK0 signal is aligned with the CK signal (e.g., with reference to FIG. 4, every other rising edge of the IWCK0 signal is synchronized with a rising edge of the CK signal).

Figure 5:
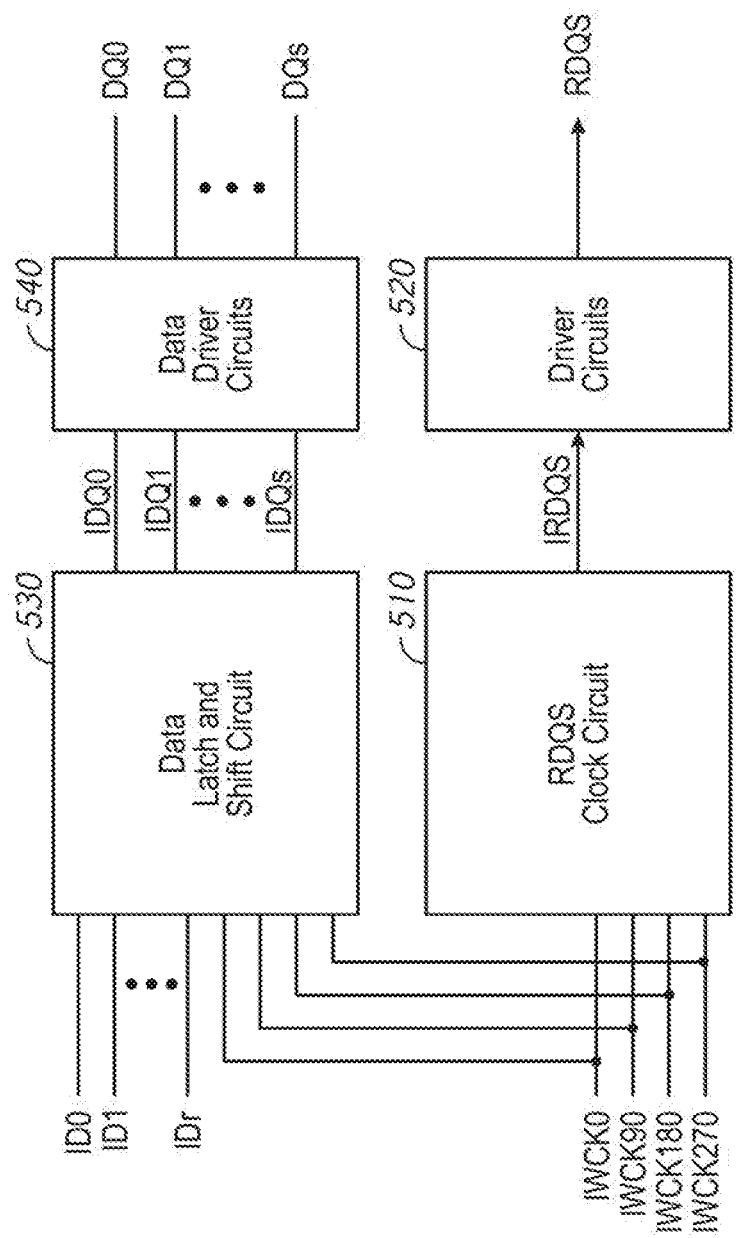
FIG. 5 is a block diagram of a portion of an IO circuit according to an embodiment of the disclosure.

FIG. 5 is a block diagram of a portion of an input/output circuit according to an embodiment of the disclosure. In some embodiments of the disclosure the portion of the input/output circuit is included in the input/output circuit 260 of FIG. 2. A RDQS clock circuit 510 and a data latch and shift circuit 530 receive multiphase clock signals IWCK0. IWCK90, IWCK180, and IWCK270 (collectively the IWCKn signals). The IWCKn signals may be quadrature clock signals, each clock signal having a 90 degree phase relative to another one of the clock signals (e.g., 0 degree clock signal, 90 degree clock signal, 180 degree clock signal, and 270 degree clock signal). The IWCKn signals may be based on data clock signals WCK and WCKF, and have a clock frequency that is lower than a clock frequency of the WCK and WCKF signals. In some embodiments of the disclosure, the IWCKn signals have half the clock frequency of the WCK and WCKF signals. The multiphase clock signals IWCKn may be provided by a data clock path that receives the WCK signal. For example, in some embodiments of the disclosure, the IWCKn signals may be provided by the data clock path 330 shown in FIG. 3.

The RDQS clock circuit 510 provides an internal strobe signal IRDQS based on the IWCKn signals. The IRDQS signal is provided to the driver circuits 520. The driver circuits 520 provide a data strobe signal RDQS based on the IRDQS signal. The RDQS signal may be provided to a device (e.g., a controller 10) for timing the receipt of data by the device. The clock frequency of the RDQS signal may be greater than the clock frequency of the IWCKn signals. In some embodiments of the disclosure, the RDQS signal has a clock frequency that is twice the clock frequency of the IWCKn signals. Where the clock frequency of the IWCKn signals is one-half the clock frequency of the WCK and WCKF signals, the RDQS signal may have the same clock frequency as the WCK and WCKF signals.

In addition to the IWCKn signals, the data latch and shift circuit 530 receives internal data ID0-IDr, where r is a non-zero whole number. The ID0-IDr data may be provided from a memory array. For example, in some embodiments of the disclosure, the ID data is provided from the memory array 250 to an input output circuit 260 that includes the data latch and shift circuit 530. The data latch and shift circuit 530 latches and shifts the internal data ID0-IDr based on the IWCKn signals to provide data IDQ0-IDQs where s is a non-zero whole number. The IDQ0-IDQs data is provided to data driver circuits 540 that drive the IDQ0-IDQs data as DQ0-DQs data. The data driver circuits 540 may include (s+1) data driver circuits, in particular, one data driver circuit for each of the IDQ0-IDQs data.

In operation, the data latch and shift circuit 530 shifts (r+1) bits wide ID0-IDr data into (s+1) bits wide IDQ0-IDQs data based on the IWCKn signals. The IDQ0-IDQs data is then provided by the data driver circuits 540 as (s+1) bits wide DQ0-DQs data. The DQ0-DQs data may be provided with a timing that corresponds with the RDQS signal. For example, one bit for each of the DQ0-DQs data may be provided at a rising clock edge and a falling clock edge of the RDQS signal. As a result, at each edge of the RDQS signal (s+1) bits are output in parallel. In this manner, the (s+1) bits of the DQ0-DQs data may be received, for example, by a device, as timed according to RDQS signal.

As will be described in more detail below, a controller provides a memory system memory commands to access memory (e.g., read or write memory). The commands are decoded by a command decoder (e.g., command decoder 215), which provides internal signals and commands for performing operations, such as operations to access the memory array. The memory commands provided for accessing memory include timing command and access commands. As previously described, timing commands may be used to control the timing of various operations, for example, for a corresponding access command. Examples of access commands include a read command and a write command. Examples of timing commands include a CAS command and a MPC command. The timing commands may include opcodes that set various modes of operation during an associated access operation for an access command. For example, bits of information associated with various opcodes are included in the riming command. An opcode may include one or more bits of the timing command. The opcodes may be identified by a bit positron of the timing command.

FIG. 6A is a diagram of a command structure 600 for a timing command according to an embodiment of the disclosure. The timing command of FIG. 6A is a CAS command. The CAS command may be provided by a controller to a memory including a command decoder that decodes the CAS command and provides internal control signals to perform operations based on the CAS command. The CAS command of FIG. 6A includes 14-bits, a first seven bits CA0-CA6 received at a rising edge R1 of the CK signal and a second seven bits CA0-CA6 received at a falling edge F1 of the CK signal. A controller provides the first seven bits at the rising edge R1 of the CK signal and then changes the bits to provide the second seven bits at the falling edge F1 of the CK signal. The CAS command is received by a memory that is enabled by a respective high level CS signal at the rising edge R1 of the CK signal.

The first seven bits CA0-CA6 of the CAS command received by the memory at the rising edge R1 of the CK signal and decoded by a command decoder include, for example in FIG. 6A, a command code for the CAS command and various clock signal synchronization options. In particular, the first seven bits CA0-CA6 of the CAS command include: a four bit command code corresponding to bits CA0-CA3; a WCK-CK synchronization with write command option WS_WR corresponding to bit CA4; a WCK-CK synchronization with read command option WS_RD corresponding to bit CA5; and a WCK-CK fast synchronization option WS_FS corresponding to bit CA6. The command code for the CAS command of FIG. 6A is 0011 (LLHH in FIG. 6A) corresponding to bits CA0-CA3.

WCK-CK synchronization is performed by the memory to determine the relationship between the CK/CKF signals and the WCK/WCKF signals, and between the WCK/WCKF signals and internal clock signals that are generated based on the WCK/WCKF signals (e.g., multiphase IWCKn signals). Determining the relationships of CK/CKF, WCK/WCKF, and internal clock signals may be necessary for proper operation of the memory. A WCK-CK synchronization option may be enabled by providing a 1 value corresponding to the bit CA. The WCK-CK synchronization with write command option WS_WR may be used with a WRITE command for performing a write operation, and enabled when the CA4 bit is 1 (e.g., WS_WR=1) for the first seven bits of the CAS command. The WCK-CK synchronization with read command option WS_RD may be used with a READ command for performing a read operation, and enabled when the CA5 bit is a 1 (e.g., WS_RD=1) for the first seven bits of the CAS command.

The WCK-CK fast synchronization option WS_FS may be used with an access command (e.g., READ command. WRITE command, etc.) and enabled when the CA6 bit is a 1 (e.g., WS_FS=1) for the first seven bits of the CAS command. The WCK-CK fast synchronization option may be desirable for rank-to-rank access operations, which involve accessing multiple ranks of memory. When the WCK-CK fast synchronization option is enabled, the WCK-CK synchronization operation may be performed with a flexible timing relative to when the CAS command is received by the memory.

The second seven bits CA0-CA6 of the CAS command received by the memory at the falling edge F1 of the CK signal include, for example in FIG. 6A, various opcodes of features for the WCK-CK synchronization options of the first seven bits of the CAS command. Additionally, when the WCK-CK fast synchronization option is enabled (e.g., WS_FS=1), the definition of the second seven bits CA0-CA6 of the CAS command changes compared to when the WCK-CK synchronization option is not enabled (e.g., WS_FS=0).

For example, with reference to FIG. 6A, when WS_FS=0, the second seven bits CA0-CA6 of the CAS command received at the falling edge F1 of the CK signal include: a four bit opcode DC0-DC3 corresponding to bits CA0-CA3 for a first feature related to the WCK-CK synchronization with write command option WS_WR; a one bit opcode V corresponding to bit CA4 for a second feature related to the WCK-CK synchronization with w rite command option WS_WR; a one bit opcode WRX corresponding to bit CA5 for a third feature related to the WCK-CK synchronization with write command option WS_WR; and a one bit opcode B3 corresponding to bit CA6 for a feature related to the WCK-CK synchronization with read command option WS_RD.

However, when WS_FS=1, the second seven bits CA0-CA6 of the CAS command include: a two bit opcode DC0 and DC1 corresponding to bits CA0 and CA1 for the first feature related to the WCK-CK synchronization with write command option WS_WR; a three bit opcode WCKENL_OTF corresponding to bits CA2-CA4 for a feature related to the WCK-CK fast synchronization option WS_FS; a one bit opcode WRX corresponding to bit CA5 for the third feature related to the WCK-CK synchronization with write command option WS_WR; and a one bit opcode B3 corresponding to bit CA6 for the feature related to the WCK-CK synchronization with read command option WS_RD.

As will be described in more detail below, the WCKENL_OTF opcode may be used to add delay to when the WCK-CK fast synchronization option is enabled. In some embodiments of the disclosure, an amount of delay to be added may be selected based on the value for the WCKENL_OTF opcode. Having the ability to add different amounts of delay for the WCK-CK fast synchronization operation provides flexibility for the timing of the CAS command and the access command. The timing of the CAS command and when WCK-CK fast synchronization is performed may be used to improve performance of the memory, for example, reduce power consumption by the memory during operation.

While the CAS command of FIG. 6A includes a second seven bits having an opcode WCKENL_OTF for the WS_FS option, in other embodiments of the disclosure, the CAS command may include additional or alternative opcodes for one or more of the WS_WR, WS_RD, WS_FS options of the CAS command. For example, the second seven bits of the CAS command may include opcodes for adding delay for when to perform the WCK-CK synchronization operation for the WS_WR and/or WS_RD options when enabled. Another example includes having an alternative opcode for the WS_FS option, and yet another example includes having an additional opcode for the WS_FS option. The particular definition of bits for the CAS command of FIG. 6A is not intended to limit the scope of the disclosure to the particular example described.

FIG. 6B is a diagram WCKENL_OTF opcodes according to an embodiment of the disclosure. In some embodiments of the disclosure, the WCKENL_OTF opcodes of FIG. 6B may be used with the CAS command of FIG. 6A.

Different amounts of delay may be added to the timing of when WCK-CK synchronization may be performed relative to the CAS command. The different amounts of delay may be selected by providing the WCKENL_OTF opcode having a value corresponding to the desired delay. For example, where no additional delay is to be added to when the WCK-CK synchronization is performed, WCKENL_OTF=000; where 1 tCK of delay is to be added to when the WCK-CK synchronization is performed, WCKENL_OTF=001; where 2 tCK of delay is to be added to when the WCK-CK synchronization is performed. WCKENL_OTF=010; where 3 tCK of delay is to be added to when the WCK-CK synchronization is performed. WCKENL_OTF=011; where 4 tCK of delay is to be added to when the WCK-CK synchronization is performed, WCKENL_OTF=100; where 6 tCK of delay is to be added to when the WCK-CK synchronization is performed, WCKENL_OTF=101; where 8 tCK of delay is to be added to when the WCK-CK synchronization is performed, WCKENL_OTF=110, and where 11 tCK of delay is to be added to when the WCK-CK synchronization is performed. WCKENL_OTF=111.

Other embodiments of the disclosure may have fewer or greater amounts of delay that may be selected. Other embodiments of the disclosure may include different amounts of delay than those shown in the example of FIG. 6B. The particular number of and delay amounts for the WCKENL_OTF opcodes of FIG. 6A are not intended to limit the scope of the disclosure to the particular example described.

FIGS. 7A-7C, 8, 9, and 11 are examples of various access operations according to embodiments of the disclosure. The embodiments illustrate the use of timing commands (e.g., CAS command) with an access command (e.g., read command).

Figures 1, 7A:
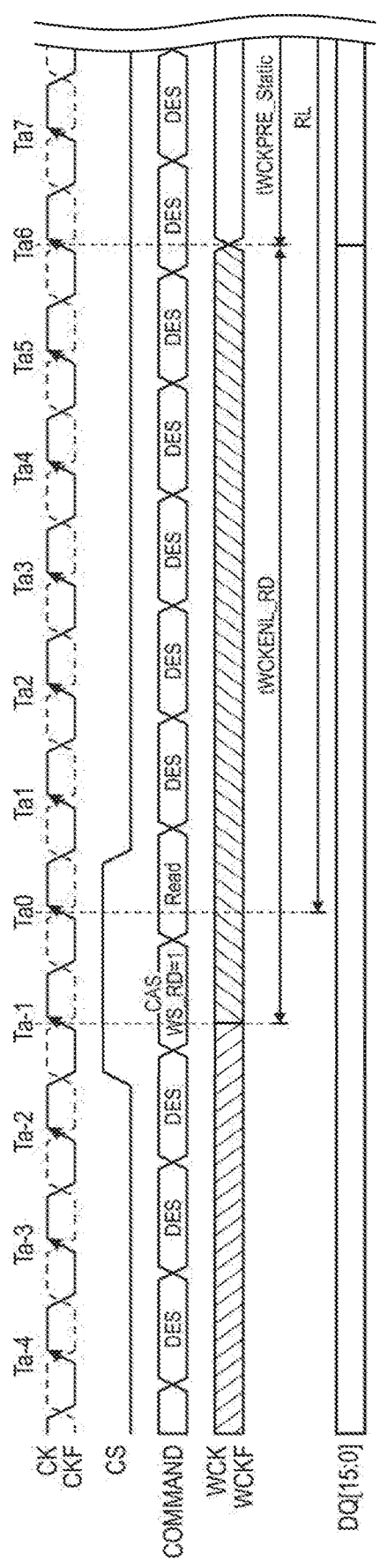
FIG. 7A (including FIGS. 7A-1 and 7A-2) is a timing diagram for a read operation with clock signal synchronization according to an embodiment of the disclosure.
Figures 2, 7A:
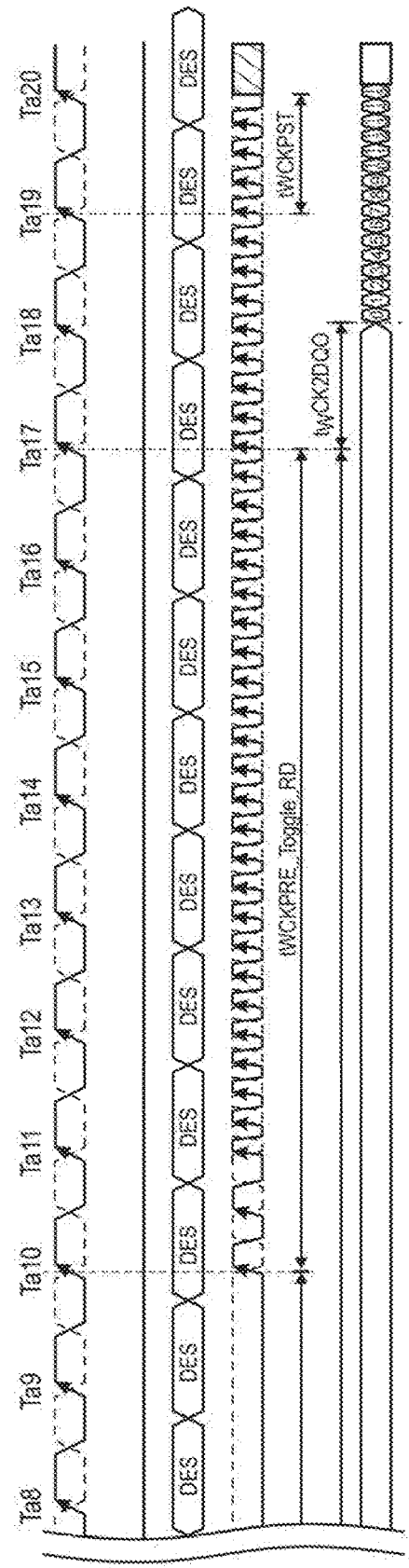
Figures 1, 7B:
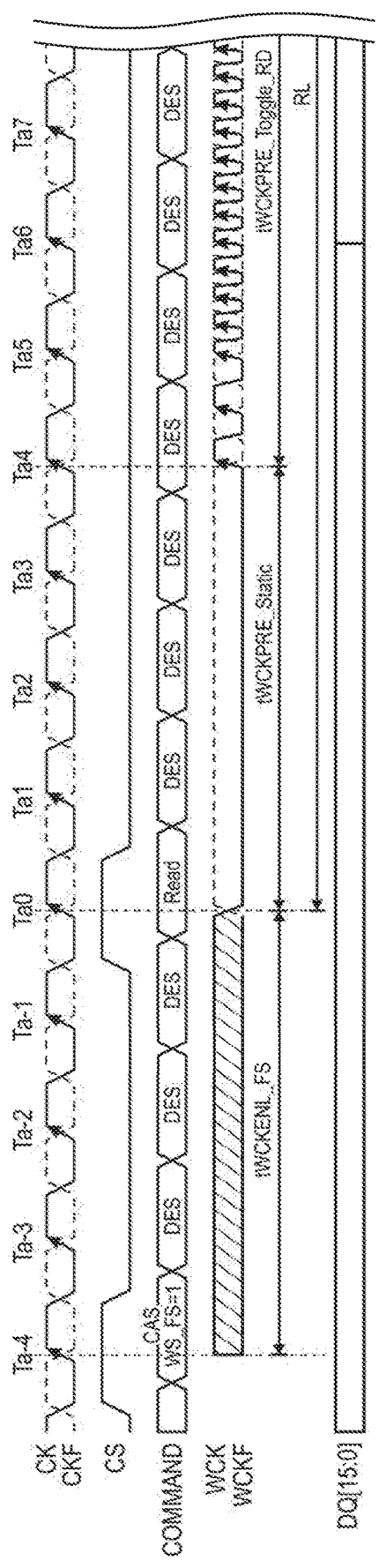
FIG. 7B (including FIGS. 7B-1 and 7B-2) is a timing diagram for a read operation with fast clock signal synchronization according to an embodiment of the disclosure.
Figures 2, 7B:
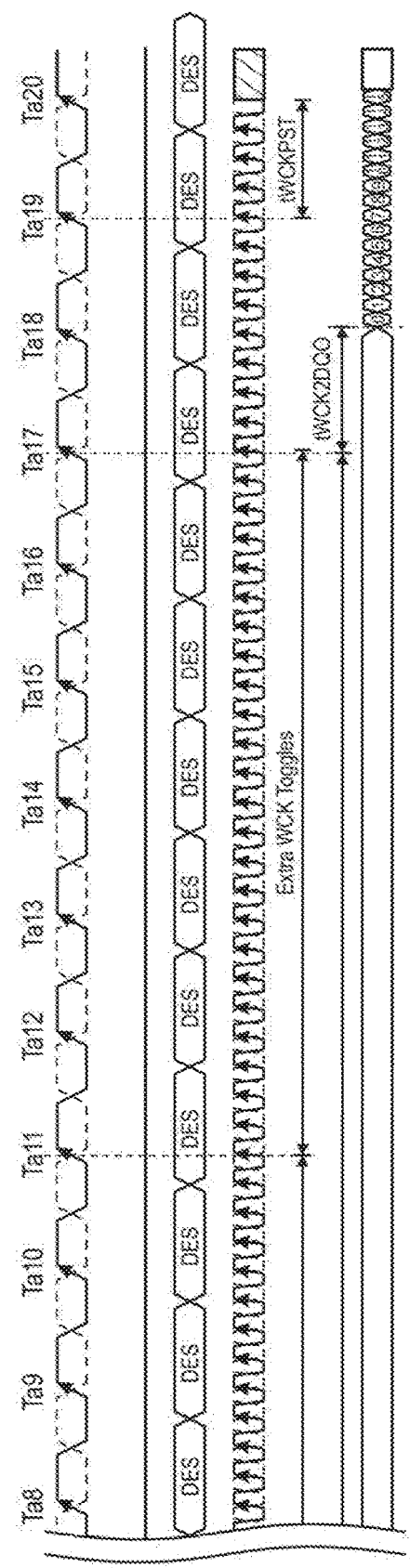
Figures 1, 7C:
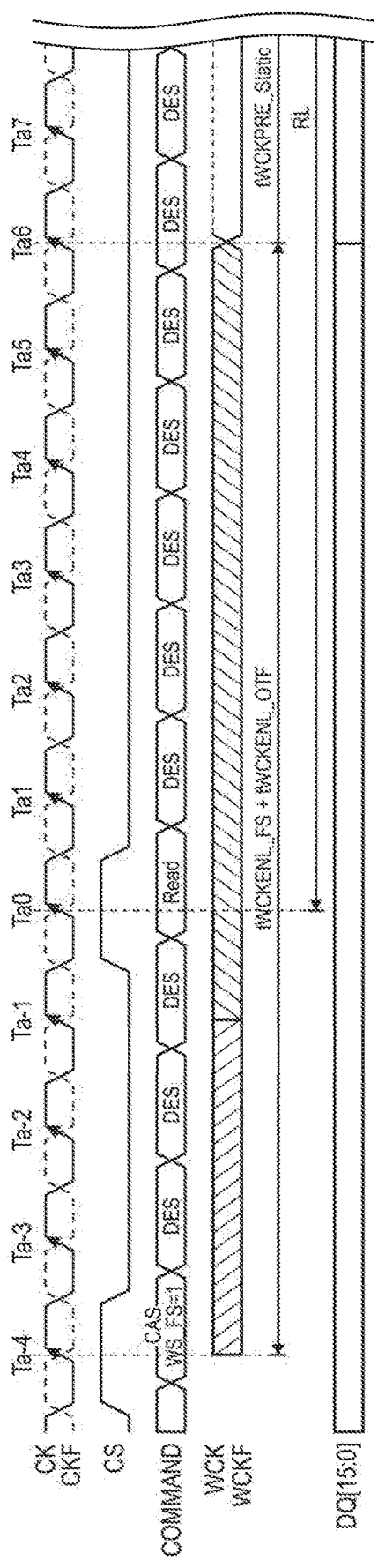
FIG. 7C (including FIGS. 7C-1 and 7C-2) is a timing diagram for a read operation with fast clock signal synchronization according to an embodiment of the disclosure.
Figures 2, 7C:
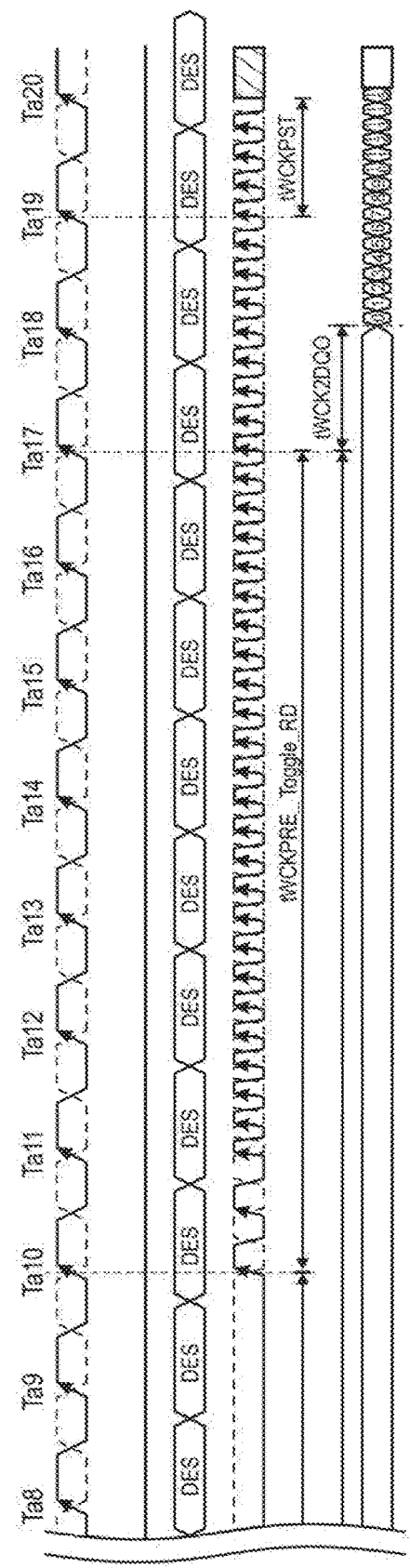

FIGS. 7A-7C are timing diagrams for various signals during access operations according to an embodiment of the disclosure. FIGS. 7A-7C will be described with reference to read operations for a system including a controller and a memory system. In some embodiments of the disclosure, the system 100 of FIG. 1 and the semiconductor device 200 of FIG. 2 may be used for the operation described with reference to FIGS. 7A-7C. FIGS. 7A-7C will be described with reference to the system 100 of FIG. 1 and the semiconductor device 200 of FIG. 2, but the scope of the disclosure is not limited to the particular system 100 or the particular semiconductor device 200. Additionally, in some embodiments of the disclosure, the CAS command has a command structure as described with reference to FIG. 6A. FIGS. 7A-7C will be described with reference to a CAS command structure of FIG. 6A, however, the scope of the disclosure is not limited to the particular command structure of FIG. 6A. The read latency for the read operation of FIGS. 7A-7C is 17 tCK (e.g., 17 clock cycles of the CK signal).

FIG. 7A (including FIGS. 7A-1 and 7A-2) is a timing diagram for a read operation with WCK-CK synchronization according to an embodiment of the disclosure. At time Ta-1, a select signal CS provided by the controller 10 is active to select a memory (e.g., semiconductor device 200 of FIG. 2). As a result, the command address input circuit of the memory receives a first seven bits of a CAS command for a rising clock edge of the CK signal at time Ta-1 and receives a second seven bits of the CAS command at a following falling clock edge of the CK signal.

The first seven bits CA0-CA6 for the CAS command include the command code for the CAS command 0011, the WCK-CK synchronization with read command option (WS_RD) is enabled, and both the WCK-CK synchronization with write command option (WS_WR) and the WCK-CK fast synchronization option (WS_FS) are not enabled. Bit CA5 for the CAS command, which corresponds to the WS_RD option, is high (WS_RD=1) for the rising clock edge of the CK signal at time Ta-1 to enable the WCK-CK synchronization with read command option. Bit CA4 for the CAS command, which corresponds to the WS_WR option, is tow (WS_WR=0) and bit CA6 for the CAS command, which corresponds to the WS_FS option, is low (WS_FS=0)

for the rising clock edge of the CK signal at time Ta-1 to not enable both the WCK-CK synchronization with write command option and the WCK-CK fast synchronization option. The second seven bits CA0-CA6 with WS_FS=0 (from the first seven bits), correspond to DC0-DC3, V, WRX, and B3. The selected memory also receives a read command READ for a rising clock edge of the CK signal at time Ta0.

The command decoder of the memory decodes the CAS and READ commands and generates the internal control signals accordingly to activate circuits for performing the WCK-CK synchronization and read operation. For example, following the CAS command at time Ta-1, die input buffer for the WCK and WCKF signals are activated by the end of time tWCKENL_RD (e.g., 7 tCK) in preparation for receiving the WCK and WCKF signals from the controller 10. Following the time tWCKENL_RD, the WCK and WCKF signals remain static for the static period tWCKPRE_Static (e.g., 4 tCK) between times Ta6 and Ta10. At time Ta10, active WCK and WCKF signals provided by the controller 10 are received by the memory, and the memory performs WCK-CK synchronization during tWCKPRE_Toggle_RD (e.g., 7 tCK) between times Ta10-Ta17 to generate internal clock signals based on the WCK and WCKF signals, which may be used to provide the RDQS signal (not shown in FIG. 7A). The RDQS signal is synchronized with the WCK and WCKF signals.

With the completion of WCK-CK synchronization by time Ta17, internal clock signals are ready for use for timing operations, such as providing data DQ. At time Ta17 (corresponding to the latency RL following the READ command at rime Ta0), the memory provides data DQ to the controller 10 within a time period tWCK2DQO of time Ta17. The memory also provides an active RDQS signal (not shown) to the controller 10 following time Ta17, and as previously described, may be used by the controller 10 for timing receipt of the data DQ. The data DQ is provided from the input/output circuit of the memory synchronized with the RDQS signal (and the WCK and WCKF signals) such that a bit of data DQ is provided for each clock edge of the RDQS signal until a data burst is complete (e.g., 16 bit data burst). While FIG. 7A show's the data DQ provided from one data terminal of the memory, data may concurrently be provided from other data terminals of the memory having the same timing to the RDQS signal.

FIG. 7B (including FIGS. 7B-1 and 7B-2) is a timing diagram for a read operation with fast WCK-CK synchronization according to an embodiment of the disclosure. At time Ta-4, a select signal CS provided by the controller 10 is active to select a memory (e.g., semiconductor device 200 of FIG. 2). As a result, the command/address input circuit of the memory receives a first seven bits of a CAS command for a rising clock edge of the CK signal at time Ta-4 and receives a second seven bits of the CAS command at a following falling clock edge of the CK signal.

The first seven bits CA0-CA6 for the CAS command include the command code for the CAS command 0011, the WCK-CK fast synchronization option (WS_FS) is enabled, and both the WCK-CK synchronization with write command option (WS_WR) and the WCK-CK synchronization with read command option (WS_RD) are not enabled. Bit CA6 for the CAS command, which corresponds to the WS_FS option, is high (WS_FS=1) for the rising clock edge of the CK signal at time Ta-4 to enable the WCK fast synchronization option. Bit CA4 for the CAS command, which corresponds to the WS_WR option, is low (WS_WR=0) and bit CAS for the CAS command, which corresponds to the WS_WR option, is low (WS_RD=0) for the rising clock edge of the CK signal at time Ta-4 to not enable both the WCK-CK synchronization with write command option and the WCK-CK synchronization with read command option. The second seven bits CA0-CA6 with WS_FS=1 (from the first seven bits), correspond to DC0, DC1, WCKENL_OTF, WRX, and B3. The selected memory also receives a read command READ for a rising clock edge of the CK signal at time Ta0.

The WCK and WCKF signals may be provided earlier relative to the timing shown in FIG. 7A when the WCK-CK fast synchronization mode is enabled (WS_FS=1). With the WCK-CK fast synchronization mode enabled, the input buffers for the WCK and WCKF signals are enabled earlier in preparation for receiving the WCK and WCKF signals from the controller 10 earlier. In comparison to the WCK and WCKF signal timing shown in FIG. 7A where the WCK-CK fast synchronization mode is not enabled (WS_FS=0), the memory is ready to receive the WCK and WCKF signals from the controller 10 earlier when the WCK-CK fast synchronization mode is enabled. For example, as shown in the example of FIG. 7B, the WCK and WCKF signals are provided 6 tCK earlier than for the example of FIG. 7A. The controller 10 may enable the WCK-CK fast synchronization mode in order to provide the WCK and WCKF signals earlier to allow the memory to begin generating internal signals based on the WCK and WCKF signals.

The command decoder of the memory decodes the CAS and READ commands and generates the internal control signals to activate circuits for performing WCK-CK fast synchronization and the read operation. For example, following the CAS command at time Ta-4, the input buffer for the WCK and WCKF signals are activated by the end of time tWCKENL_FS (e.g., 4 tCK) in preparation for receiving the WCK and WCKF signals from the controller 10. Following the time tWCKENL_FS, the WCK and WCKF signals remain static for the static period tWCKPRE_Static (e.g., 4 tCK) between times Ta0 and Ta4. At time Ta4, active WCK and WCKF signals provided by the controller 10 are received by the memory, and the memory performs WCK-CK synchronization during tWCKPRE_Toggle_RD (e.g., 7 tCK) between times Ta4-Ta11 to generate internal clock signals based on the WCK and WCKF signals, which may be used to provide a RDQS signal (not shown in FIG. 7B) that may be synchronized with the WCK and WCKF signals.

With the completion of WCK-CK synchronization by time Ta11, internal clock signals are ready for use for timing operations, such as providing data, following time Ta11. As previously described, however, the latency RL is assumed to be 17 tCK in the present example. Between times Ta11 and Ta17, that is between when the WCK-CK fast synchronization is complete and when data DQ is to be provided by the memory to the controller 10, the WCK and WCKF signals, as well as internal clock signals generated based on the WCK and WCKF signals, continue toggling despite the clock signals not being needed for any memory operations at that time.

At time Ta17 (corresponding to the latency RL following the READ command at time Ta0), the memory is ready to provide data DQ. The memory provides data DQ to the controller 10 within a time period tWCK2DQO of time Ta17. The memory also provides an active RDQS signal (not shown) to the controller 10 following time Ta17, and as previously described, may be used by the controller 10 for timing receipt of the data DQ. The data DQ is provided from the input/output circuit of the memory synchronized with the RDQS signal (and the WCK and WCKF signals) such that a bit of data DQ is provided for each clock edge of the RDQS signal until a data burst is complete (e.g., 16 bit data burst). While FIG. 7B shows the data DQ provided from one data terminal of the memory, data may concurrently be provided from other data terminals of the memory having the same timing to the RDQS signal.

As previously described, during the time between time Ta11 when the WCK-CK synchronization is complete and time Ta17 when the data DQ is to be provided by the memory, the WCK and WCKF signals continue to toggle although the WCK and WCKF signals are not needed for memory operations. However, during the 6 tCK (and 24 tWCK of the WCK and WCKF signals) of toggling, power is consumed by memory circuits that receive the WCK and WCKF signals and generate and provide internal clock signals from the WCK and WCKF signals. Power consumption during this time when the WCK and WCKF signals are unnecessarily provided may be undesirable in low power systems.

FIG. 7C (including FIGS. 7C-1 and 7C-2) is a timing diagram for a read operation with fast WCK-CK synchronization according to an embodiment of the disclosure. The timing diagram of FIG. 7C is similar to the timing diagram of FIG. 7B. However, in contrast to the FIG. 7B, delay is added in FIG. 7C to when WCK-CK synchronization is performed. The added delay may reduce the time of unnecessary clock toggling, and consequently, may reduce power consumption in comparison to not having added delay (e.g., the timing shown in FIG. 7B). At time Ta-4, a select signal CS provided by the controller 10 is active to select a memory (e.g., semiconductor device 200 of FIG. 2). As a result, the command/address input circuit of the memory receives a first seven bits of a CAS command for a rising clock edge of the CK signal at time Ta-4 and receives a second seven bits of the CAS command at a following falling clock edge of the CK signal.

The first seven bits CA0-CA6 for the CAS command include the command code for the CAS command 0011, the WCK fast synchronization option (WS_FS) is enabled, and both the WCK-CK synchronization with write command option (WS_WR) and the WCK-CK synchronization with read command option (WS_RD) are not enabled. Bit CA6 for the CAS command, which corresponds to the WS_FS option, is high (WS_FS=1) for the rising clock edge of the CK signal at time Ta-4 to enable the WCK fast synchronization option. Bit CA4 for the CAS command, which corresponds to the WS_WR option, is low (WS_WR=0) and bit CA5 for the CAS command, which corresponds to the WS_WR option, is low (WS_RD=0) for the rising clock edge of the CK signal at time Ta-4 to not enable both the WCK-CK synchronization with write command option and the WCK-CK synchronization with read command option. The second seven bits CA0-CA6 with WS_FS=1 (from the first seven bits), correspond to DC0, DC1, WCKENL_OTF, WRX, and B3. The selected memory also receives a read command READ for a rising clock edge of the CK signal at time Ta0.

In contrast to the example of FIG. 7B, the WCKENL_OTF value in the example of FIG. 7C is used to add delay to when WCK-CK synchronization is performed. For example, in embodiments of the disclosure where the WCKENL_OTF opcodes are defined as shown in FIG. 6B, the WCKENL_OTF opcode has a value of 101 to add 6 tCK of delay to the time tWCKENL_FS before static WCK and WCKF signals are provided to the memory. As previously described with reference to the example of FIG. 7B, tWCKENL_FS may be 4 tCK. The additional 6 tCK added by WCKENL_OTF when the WS_FS option is enabled delays the time when the WCK and WCKF signals are expected by the memory. In the example of FIG. 7C, rather than the static WCK and WCKF signals expected at time Ta0 (as is the case in the example of FIG. 7B), the static WCK and WCKF signals are expected at time Ta6, as will be described in more detail below.

The command decoder of the memory decodes the CAS and READ commands and generates the internal control signals to activate circuits for performing WCK-CK fast synchronization and the read operation. Following the CAS command at time Ta-4, the input buffer for the WCK and WCKF signals are activated by the end of time tWCKENL_FS+WCKENL_OTF (e.g., 4 tCK+6 tCK) in preparation for receiving the WCK and WCKF signals from the controller 10. Following the time tWCKENL_FS+WCKENL_OTF, the WCK and WCKF signals remain static for the static period tWCKPRE_Static (e.g., 4 tCK) between times Ta6 and Ta10. At time Ta10, active WCK and WCKF signals provided by the controller 10 are received by the memory, and the memory performs WCK-CK synchronization during tWCKPRE_Toggle_RD (e.g., 7 tCK) between times Ta10-Ta17 to generate internal clock signals based on the WCK and WCKF signals, which may be used to provide the RDQS signal (not shown in FIG. 7C). The RDQS signal may be synchronized with the WCK and WCKF signals.

With the completion of WCK-CK synchronization by time Ta17, internal clock signals are ready for use for timing operations, such as providing data DQ. At time Ta17 (corresponding to the latency RL following the READ command at time Ta0), the memory provides data DQ to the controller 10 within a time period tWCK2DQO of time Ta17. The memory also provides an active RDQS (not shown) signal following time Ta17, that is provided by the memory to the controller 10, and as previously described, may be used for timing receipt of the data DQ. The data DQ is provided from the input/output circuit of the memory synchronized with the RDQS signal (and the WCK and WKF signals) such that a bit of data DQ is provided for each clock edge of the RDQS signal until a data burst is complete (e.g., 16 bit data burst). While FIG. 7C shows the data DQ provided from one data terminal of the memory, data may concurrently be provided from other data terminals of the memory having the same timing to the RDQS signal.

In comparison to the example of FIG. 7B, the example of FIG. 7C does not include WCK and WCKF signals toggling earlier than needed to perform the memory operation with WCK-CK fast synchronization. As previously described with reference to FIG. 7B, WCK-CK synchronization is complete by time Ta11, and WCK and WCKF signals continue to toggle between time Ta11 and Ta17 although the WCK and WCKF signals are not needed during this time for providing data DQ. With reference to FIG. 7C, adding delay to when WCK-CK synchronization is performed reduces (and may eliminate) time during which the WCK and WCKF signals toggle, but are not needed for a memory operation. The delay added by using the WCKENL_OTF opcode for the WS_FS option may be useful in reducing memory power consumption compared to operation without adding any delay to the WCK-CK synchronization (e.g., the example of FIG. 7B).

While the embodiments of FIGS. 7A-7C are described in the context of read operations, it will be appreciated that the timing commands may be used in the context of write operations without departing from the scope of the disclosure. For example, the CAS command may be used for write operations. Rather than receiving read commands from the controller and providing data to the controller, the memory receives write commands from the controller and receives data from the controller to be stored.

Figures 1, 2, 8:
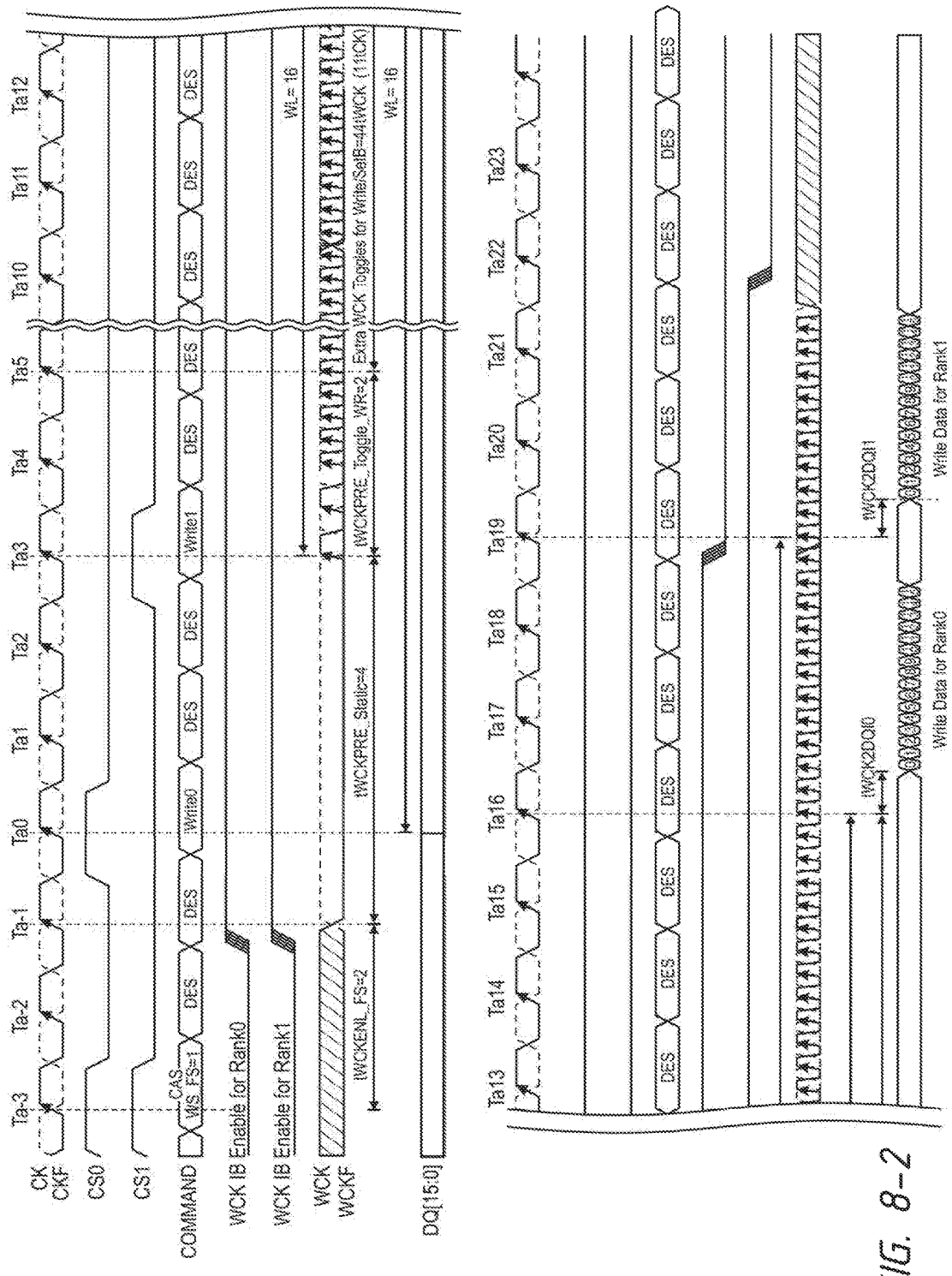
FIG. 8 (including FIGS. 8-1 and 8-2) is a timing diagram for rank-to-rank write operations with clock signal synchronization according to an embodiment of the disclosure.

FIGS. 8 and 9 are timing diagrams for various signals during rank-to-rank access operations according to an embodiment of the disclosure. FIGS. 8 and 9 will be described with reference to rank-to-rank write operations for a system including a controller and a memory system. In some embodiments of the disclosure, the system 100 of FIG. 1 and the semiconductor device 200 of FIG. 2 may be used for the operation described with reference to FIGS. 8 and 9. FIGS. 8 and 9 will be described with reference to the system 100 of FIG. 1 and the semiconductor device 200 of FIG. 2, but the scope of the disclosure is not limited to the particular system 100 or the particular semiconductor device 200. Additionally, in some embodiments of the disclosure, the CAS command has a command structure as described with reference to FIG. 6A. FIGS. 8 and 9 will be described with reference to a CAS command structure of FIG. 6A, however, the scope of the disclosure is not limited to the particular command structure of FIG. 6A. The write latency WL for the write operation of FIGS. 8 and 9 is 16 tCK (e.g., 16 clock cycles of the CK signal).

FIG. 8 (including FIGS. 8-1 and 8-2) is a timing diagram for rank-to-rank write operations with WCK-CK synchronization according to an embodiment of the disclosure. At time Ta-3, select signals CS0 and CS1 provided by the controller 10 are active to select Device1 (Rank0) and Device1 (Rank1). As a result, command-address input circuits of Device1 and Device1 receive a first seven bits of a CAS command for a rising clock edge of the CK signal at time Ta-3 and receives a second seven bits of the CAS command at a following falling clock edge of the CK signal.

The first seven bits CA0-CA6 for the CAS command include the command code for the CAS command 0011, the WCK-CK fast synchronization option (WS_FS) is enabled, and both the WCK-CK synchronization with write command option (WS_WR) and the WCK-CK synchronization with read command option (WS_RD) are not enabled. Bit CA6 for the CAS command, which corresponds to the WS_FS option, is high (WS_FS=1) for the rising clock edge of the CK signal at time Ta-3 to enable the WCK fast synchronization option. Bit CA4 for the CAS command, which corresponds to the WS_WR option, is low (WS_WR=0) and bit CA5 for the CAS command, which corresponds to the WS_WR option, is low (WS_RD=0) for the rising clock edge of the CK signal at lime Ta-3 to not enable both the WCK-CK synchronization with write command option and the WCK-CK synchronization with read command option. The second seven bits CA0-CA6 with WS_FS=1 (front the first seven bits), correspond to DC0, DC1, WCKFNL_OTF, WRX, and B3.

As previously described, the WCK and WCKF signals may be provided earlier when the WCK-CK fast synchronization mode is enabled in comparison to when the WCK-CK fast synchronization mode is not enabled. With the WCK-CK fast synchronization mode enabled, the input buffers for the WCK and WCKF signals of Device0 and Device1 are enabled following the CAS command in preparation for receiving the WCK and WCKF signals from the controller 10. As shown in FIG. 8, the WCK and WCKF input buffers for Device0 and Device1 are enabled by an end of time WCKENL_FS (e.g., 2 tCK) between times Ta-3 and Ta-1 (as represented in FIG. 8 by the WCK IB enable for Rank0 and WCK IB enable for Rank1 becoming active by the end of time WCKENL_FS).

After the input buffers for the WCK and WCKF signals for Device0 and Device1 are enabled, the controller 10 provides static WCK and WCKF signals at time Ta-1. The WCK and WCKF signals remain static (at the low clock level and the high clock level, respectively) for the static period tWCKPRE_Static between times Ta-1 and Ta3. At time Ta3, active WCK and WCKF signals provided by the controller 10 are received by Device0 and Device1. Both Device0 and Device1 perform WCK-CK synchronization over tWCKPRE_toggle_WR between times Ta3 and Ta5 to generate internal clock signals based on the WCK and WCKF signals, which may be used for timing receipt of data during the write operation.

Referring back to time Ta0, the select signal CS0 is active to select the Device0 so that a write command WRITE provided at time Ta0 is received by Device0 for a rising clock edge of the CK signal. With a write latency of 16 tCK, data for the WRITE command at time Ta0 will be provided to Device0 following time Ta16. The select signal CS1 is active at time Ta3 to select the Device1 so that a write command WRITE provided at time Ta3 is received by Device1 for a rising clock edge of the CK signal at time Ta3. With a write latency of 16 tCK, data for the WRITE command at time Ta3 will be provided by Device1 following time Ta19.

With the completion of WCK-CK synchronization by time Ta5, internal clock signals are ready for use for timing operations, such as receiving data, following time Ta5. As previously described, however, the latency WL is assumed to be 16 tCK in the present example. Between times Ta5 and Ta16, that is, between when the WCK-CK fast synchronization is complete and when data DQ is to be received by the memory, the WCK and WCKF signals, as well as internal clock signals generated based on the WCK and WCKF signals, continue toggling despite the clock signals not being needed for any memory operations at that time.

Following time Ta16, the Device0 receives data DQ from the controller 10 within a time tWCK2DQI0 of time Ta16 for the WRITE command at time Ta0 (for Rank0). Following time Ta19, the Device1 receives data DQ from the controller 10 within a time tWCK2DQI1 of time Ta19 for the WRITE command at time Ta3 (for Rank1). The data DQ provided to Device0 and Device1 are synchronized with the WCK and WCKF signals such that a bit of data DQ is received for each clock edge of the WCK and WCKF signals until a data burst is complete (e.g., a 16-bit data burst is shown in FIG. 8). While FIG. 8 shows the data DQ provided to one data terminal of Device0 and Device1, data may also be provided concurrently to the other data terminals of Device0 and Device1 having the same relative timing.

The input buffers for WCK and WCKF signals for Device0 and Device 1 are disabled following completion of receiving the data DQ. For example, following receipt of the last bit of data DQ for Rank0, the WCK IB Enable signal for Rank0 becomes inactive (inactive low logic level) indicating the disablement of the input buffers for WCK and WCKF signals of Device0. Similarly, following receipt of the last bit of data DQ for Rank1, the WCK IB Enable signal for Rank1 becomes inactive (inactive low logic level) indicating the disablement of the input buffers for WCK and WCKF signals of Device1.

As previously described, during the time between time Ta5 when WCK-CK synchronization is complete and time Ta16 when the data DQ is to be provided to the Device0, the WCK and WCKF signals continue to toggle although the WCK and WCKF signals are not needed for memory operations. However, during the 11 tCK (and 44 tWCK of the WCK and WCKF signals) of toggling, power is consumed by memory circuits of Device0 and Device1 that receive the WCK and WCKF signals and generate and provide internal clock signals from the WCK and WCKF signals. Power consumption during this time then the WCK and WCKF signals are unnecessarily provided may be undesirable in low power systems.

FIG. 9 (including FIGS. 9-1 and 9-2) is a timing diagram for rank-to-rank write operations with WCK-CK synchronization according to an embodiment of the disclosure. The timing diagram of FIG. 9 is similar to the timing diagram of FIG. 8. However, in contrast to the FIG. 8, delay is added in FIG. 9 to when WCK-CK synchronization is performed. The added delay may reduce the time of unnecessary clock toggling, and consequently, may reduce power consumption in comparison to not having added delay (e.g., the timing shown in FIG. 8). At time Ta-3, select signals CS0 and CS1 provided by the controller 10 are active to select Device0 (Rank0) and Device1 (Rank1). As a result, command/address input circuits of Device0 and Device1 receive a first seven bits of a CAS command for a rising clock edge of the CK signal at time Ta-3 and receives a second seven bits of the CAS command at a following falling clock edge of the CK signal.

The first seven bits CA0-CA6 for the CAS command include the command code for the CAS command 0011, the WCK fast synchronization option (WS_FS) is enabled, and both the WCK-CK synchronization with write command option (WS_WR) and the WCK-CK synchronization with read command option (WS_RD) are not enabled. Bit CA6 for the CAS command, which corresponds to the WS_FS option, is high (WS_FS=1) for the rising clock edge of the CK signal at time Ta-3 to enable the WCK fast synchronization option. Bit CA4 for the CAS command, which corresponds to the WS_WR option, is low (WS_WR=0) and bit CA5 for the CAS command, which corresponds to the WS_WR option, is low (WS_RD=0) for the rising clock edge of the CK signal at time Ta-3 to not enable both the WCK-CK synchronization with write command option and the WCK-CK synchronization with read command option. The second seven bits CA0-CA6 with WS_FS=1 (from the first seven bits), correspond to DC0, DC1, WCKENL_OTF, WRX, and B3.

In contrast to the example of FIG. 8, the WCKENL_OTF value in the example of FIG. 9 is used to add delay to when WCK-CK synchronization is performed. For example, in embodiments of the disclosure where the WCKENL_OTF opcodes are defined as shown in FIG. 6B, the WCKENL_OTF opcode has a value of 111 to add 11 tCK of delay to the time tWCKENL_FS before static WCK and WCKF signals are provided to the memory. As previously described with reference to the example of FIG. 8, tWCKENL_FS may be 2 tCK. The additional 11 tCK added by the WCKENL_OTF option when the WS_FS option is enabled delays the time when the WCK and WCKF signals are expected by the memory. In the example of FIG. 9, rather than the static WCK and WCKF signals expected at time Ta-1 (as is the case in the example of FIG. 8), the static WCK and WCKF signals are expected at time Ta10, as will be described in more detail below.

At time Ta0, the select signal CS0 is active to select the Device0 so that a write command WRITE provided at time Ta0 is received by Device0 for a rising clock edge of the CK signal. With a write latency of 16 tCK, data for the WRITE command at time Ta0 will be provided to Device0 following time Ta16. The select signal CS1 is active at time Ta3 to select the Device1 so that a write command WRITE provided at time Ta3 is received by Device1 for a rising clock edge of the CK signal at time Ta3. With a write latency of 16 tCK, data for the WRITE command at time Ta3 will be provided by Device1 following time Ta19.

The input buffers for the WCK and WCKF signals of Device0 and Device1 will be enabled in preparation for receiving the WCK and WCKF signals from the controller 10. However, with the added delay of 11 tCK using WCKENL_OTF, the input buffers for the WCK and WCKF signals of Device0 and Device1 are enabled by time Ta10, which is 13 tCK following the CAS command at time Ta-3 (2 tCK for the time WCKENL_FS and 11 tCK added delay from WCKENL_OTF) As shown in FIG. 9, the WCK IB enable for Rank0 and WCK IB enable for Rank1 becoming active prior to time Ta10. The WCK and WCKF input buffers for Device0 and Device1 may be enabled later in comparison to the example of FIG. 8 where the delay is not added using WCKENL_OTF (e.g., the example of FIG. 8).

After the input buffers for the WCK and WCKF signals for Device0 and Device1 are enabled, the controller 10 provides static WCK and WCKF signals at time Ta4. The WCK and WCKF signals remain static (at the low clock level and the high clock level, respectively) for the static period tWCKPRE_Static between times Ta10 and Ta14. At time Ta10, active WCK and WCKF signals provided by the controller 10 are received by Device1 and Device1. Both Device0 and Device1 perform WCK-CK synchronization over tWCKPRE_toggle_WR between limes Ta14 and Ta16 to generate internal clock signals based on the WCK and WCKF signals, which may be used for timing receipt of data during the write operation.

Following time Ta16, the Device0 receives data DQ from the controller 10 within a time tWCK2DQI0 of time Ta16 for the WRITE command at time Ta0 (for Rank0). Following time Ta11, the Device1 receives data DQ from the controller 10 within a time tWCK2DQI1 of time Ta19 for the WRITE command at time Ta3 (for Rank1). The data DQ provided to Device0 and Device1 are synchronized with the WCK and WCKF signals such that a bit of data DQ is received for each clock edge of the WCK and WCKF signals until a data burst is complete (e.g., a 16-bit data burst is shown in FIG. 9). While FIG. 9 shows the data DQ provided to one data terminal of Device0 and Device1, data may also be provided concurrently to the other data terminals of Device0 and Device1 having the same relative timing.

The input buffers for WCK and WCKF signals for Device0 and Device 1 are disabled following completion of receiving the data DQ For example, following receipt of the last bit of data DQ for Rank0, the WCK IB Enable signal for Rank0 becomes inactive (inactive low logic level) indicating the disablement of the input buffers for WCK and WCKF signals of Device0. Similarly, following receipt of the last bit of data DQ for Rank1, the WCK IB Enable signal for Rank1 becomes inactive (inactive low logic level) indicating the disablement of the input buffers for WCK and WCKF signals of Device1.

In comparison to the example of FIG. 8, the example of FIG. 9 does not include WCK and WCKF signals toggling earlier than needed to perform the memory operation with WCK-CK fast synchronization. As previously described with reference to FIG. 8, WCK-CK synchronization is complete by time Ta5, and WCK and WCKF signals continue to toggle between time Ta5 and Ta16 although the WCK and WCKF signals are not needed during this time for receiving data DQ. With reference to FIG. 9, adding delay to when the WCK-CK synchronization is performed may reduce (and may eliminate) time during which the WCK and WCKF signals toggle, but are not needed for a memory operation. The delay added by using the WCKENL_OTF opcode may be useful in reducing memory power consumption compared to operation without adding any delay to the start of the WCK-CK synchronization (e.g., the example of FIG. 8).

As previously described, the input buffers for WCK and WCKF signals for Device0 and Device 1 are disabled following completion of the access operation. When the WCK and WCKF input buffers are disabled, WCK-CK synchronization will need to be performed again before a subsequent access operation may be performed. Performing WCK-CK synchronization again will add time to the access operation and increase overall access time, which may be undesirable.

FIG. 10A is a diagram of a command structure 1000 for a timing command according to an embodiment of the disclosure. The timing command of FIG. 6A is a CAS command. The timing command structure 1000 is similar to that of the CAS command described with reference to FIG. 6A. However, the second seven bits CA0-CA6 of the CAS command when the WCK-CK fast synchronization option is enabled in the first seven bits of the CAS command (e.g., WS_FS=1), includes a two bit opcode WCKon_OTF corresponding to bits CA0 and CA1 for a second feature related to the WCK-CK fast synchronization option WS_FS. As will be described in more detail below, the WCKon_OTF opcode may be used to extend the time the WCK and WCKF input buffers remain enabled following an access operation. In some embodiments of the disclosure, the time may be extended based on the value for the WCKon_OTF opcode. In some embodiments of the disclosure, the WCKon_OTF opcode may be used to delay the time when the WCK and WCKF input buffers are disabled following an access operation. The time may be delayed based on the value for the WCKon_OTF opcode. Having the ability to extend the time the WCK and WCKF input buffers are enabled (and/or delay the time when the WCK and WCKF input buffers are disabled) by different amounts provides flexibility for the timing of the CAS command and the access command. Extending the time the WCK and WCKF input buffers are enabled may be used to improve performance of the memory, for example, avoid re-synchronizing the WCK-CK signals to improve bandwidth and reduce power consumption by the memory during operation.

The embodiment of the command structure of FIG. 10A shows the WCKon_OTF opcode included with the WCKENL_OTF opcode. In some embodiments of the disclosure, a command structure includes the WCKon_OTF opcode without the WCKENL_OTF opcode. That is, the command structure of these embodiments of the disclosure provide an ability to extend the time the WCK and WCKF input buffers are enabled (and/or delay the time when the WCK and WCKF input buffers are disabled), but without the ability to add delay to when the WCK-CK fast synchronization option is enabled. Thus, embodiments of the disclosure are not limited to command structures that include both the WCKENL_OTF and WCKon_OTF opcodes. For example, embodiments of the disclosure include command structures that include one opcode or the other.

FIG. 10B is a diagram WCKon_OTF opcodes according to an embodiment of the disclosure. In some embodiments of the disclosure, the WCKon_OTF opcodes of FIG. 10B may be used with the CAS command of FIG. 10A.

Different amounts of time the WCK and WCKF input buffers remain enabled when the WCK-CK fast synchronization option is enabled may be measured based on a number of access commands (e.g., read (RD) or write (WR) commands) following a CAS command. The different amounts of time may be selected by providing the WCKon_OTF opcode having a value corresponding to the desired number of access commands. For example, where the WCK and WCKF input buffers remain enabled for one access command, WCKon_OTF=00; where the WCK and WCKF input buffers remain enabled for two access commands, WCKon_OTF=01; where the WCK and WCKF input buffers remain enabled for four access commands, WCKon_OTF=10; and where the WCK and WCKF input buffers remain enabled for eight access commands, WCKon_OTF=11.

Other embodiments of the disclosure may have fewer or greater number of access commands that may be selected. Other embodiments of the disclosure may include different numbers of access commands than those shown in the example of FIG. 10B. The particular number access commands for the WCKon_OTF opcodes of FIG. 10A are not intended to limit the scope of the disclosure to the particular example described.

FIG. 10C is a diagram WCKon_OTF opcodes according 10 an embodiment of the disclosure. In some embodiments of the disclosure, the WCKon_OTF opcodes of FIG. 10C may be used with the CAS command of FIG. 10A.

Different amounts of time the WCK and WCKF input buffers remain enabled when the WCK-CK fast synchronization option is enabled may be measured based on a number of additional clock cycles of the CK and CKF signals the WCK and WCKF input buffers remain enabled following completion of an access operation. The different amounts of time may be selected by providing the WCKon_OTF opcode having a value corresponding to the desired number of clock cycles. For example, where the WCK and WCKF input buffers remain enabled for zero clock cycles following completion of an access operation, WCKon_OTF=00; where the WCK and WCKF input buffers remain enabled for four clock cycles following completion of an access operation, WCKon_OTF=01; where the WCK and WCKF input buffers remain enabled for eight clock cycles following completion of an access operation, WCKon_OTF=10; and where the WCK and WCKF input buffers remain enabled for sixteen clock cycles following completion of an access operation. WCKon_OTF=11.

Other embodiments of the disclosure may have fewer or greater number of clock cycles that may be selected. Other embodiments of the disclosure may include different numbers of clock cycles than those shown in the example of FIG. 10C. The particular number of clock cycles for the WCKon_OTF opcodes of FIG. 10A are not intended to limit the scope of the disclosure to the particular example described.

Figures 1, 11:
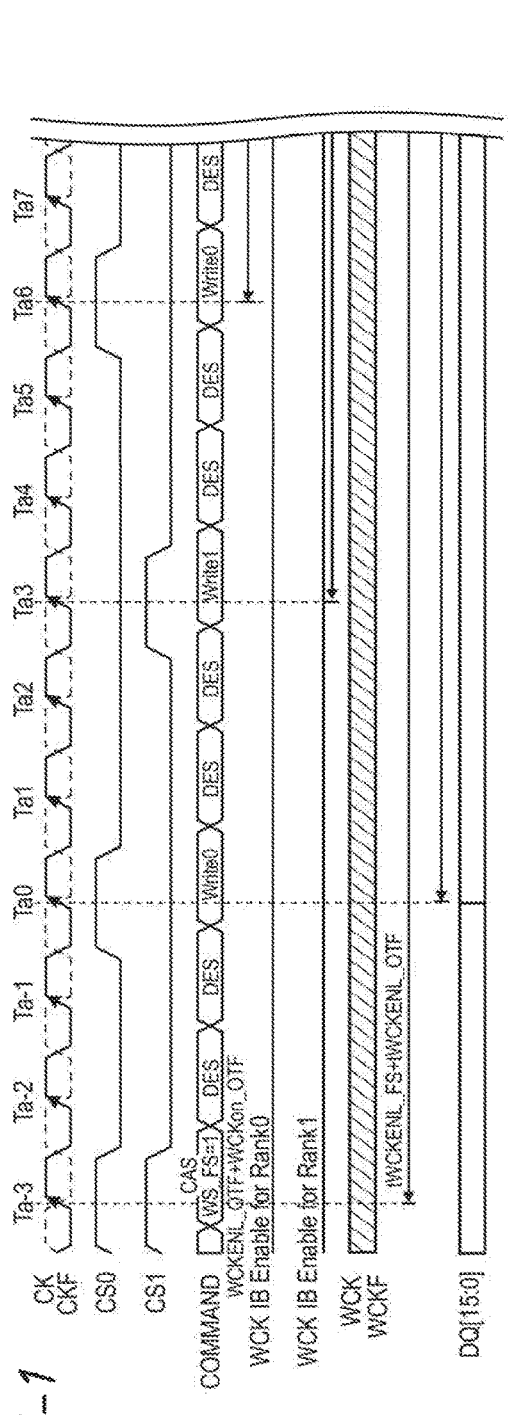
FIG. 11 (including FIGS. 11-1 and 11-2) is a timing diagram for various signals during rank-to-rank access operations according to an embodiment of the disclosure.
Figures 2, 11:
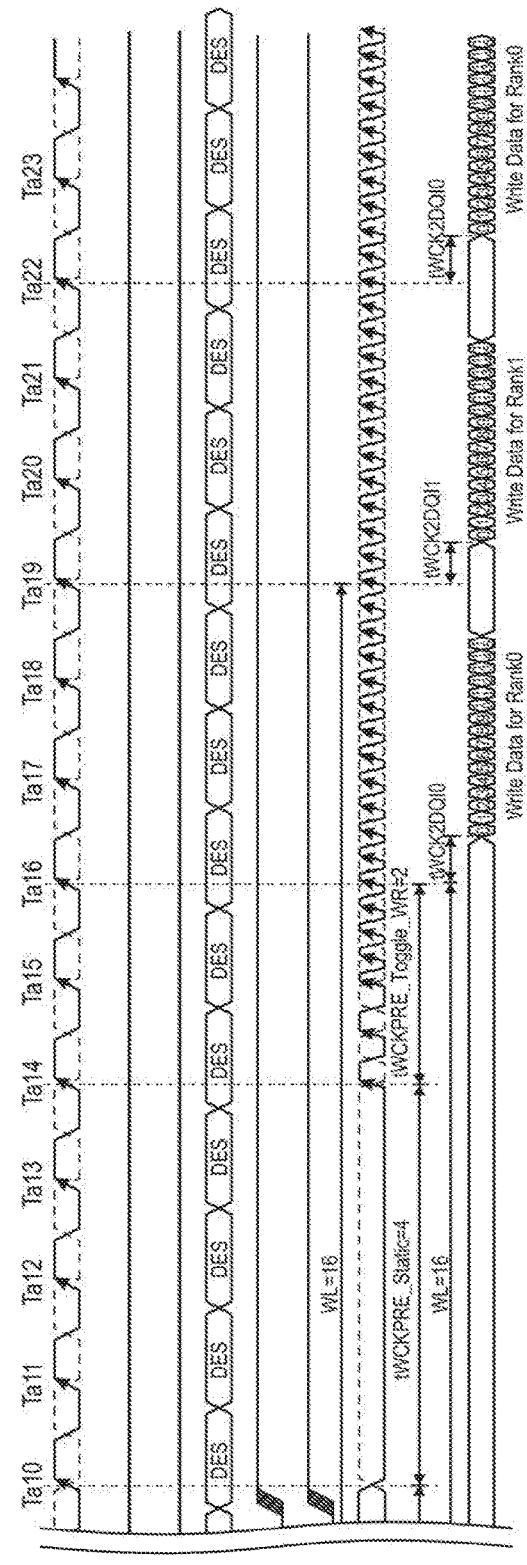

FIG. 11 (including FIGS. 11-1 and 11-2) is a timing diagram for various signals during rank-to-rank access operations according to an embodiment of the disclosure. FIG. 11 will be described with reference to rank-to-rank write operations for a system including a controller and a memory system. In some embodiments of the disclosure, the system 100 of FIG. 1 and the semiconductor device 200 of FIG. 2 may be used for the operation described with reference to FIG. 11. FIG. 11 will be described with reference to the system 100 of FIG. 1 and the semiconductor device 200 of FIG. 2, but the scope of the disclosure is not limited to the particular system 100 or the particular semiconductor device 200. Additionally, in some embodiments of the disclosure, the CAS command has a command structure as described with reference to FIG. 10A. FIG. 11 will be described with reference to a CAS command structure of FIG. 10A, however, the scope of the disclosure is not limited to the particular command structure of FIG. 10A. The write latency WL for the write operation of FIG. 11 is 16 tCK (e.g., 16 clock cycles of the CK signal).

The example of FIG. 11 is similar to the example of FIG. 9. However, in comparison with the example of FIG. 9, in the example of FIG. 11 the CAS command provided at time Ta-3 includes a WCKon_OTF option to extend the time WCK and WCKF input buffers remain enabled following an access operation. For example, in embodiments of the disclosure using the command structure 1000 of FIG. 10A for the CAS command, bits CA0 and CA1 of the second seven bits at a falling edge of the CK signal when the WS_FS option is enabled may include a value corresponding to an extended time, for example, as shown in FIG. 10B or 10C, as will be described in more detail below. Additionally, the example of FIG. 11 includes a second WRITE command provided to Device0 (Rank0) at time Ta6 with data DQ for the second WRITE command provided to Device0 within tWCK2DQI0 of Ta22. As a result of extending the time the WCK and WCKF input buffers are enabled, the WCK and WCKF input buffers of Device0 and Device1 in the example of FIG. 11 are not disabled following the completion of the respective write operations for the WRITE command for Device0 at time Ta1 and for the WRITE command for Device1 at time Ta3 (as illustrated in FIG. 11 by the WCK IB Enable signals for Rank0 and Rank1 remaining active following the respective write operation). The previous description for the example of FIG. 9 will not repeated with reference to FIG. 11 in the interest of brevity. However, the differences between the examples of FIGS. 9 and 11 will be described in more detail.

The First seven bits CA0-CA6 for the CAS command received at time Ta-3 include the command code for the CAS command 0011, the WCK fast synchronization option (WS_FS) is enabled, and both the WCK-CK synchronization with write command option (WS_WR) and the WCK-CK synchronization with read command option (WS_RD) are not enabled. Bit CA6 for the CAS command, which corresponds to the WS_FS option, is high (WS_FS=1) for the rising clock edge of the CK signal at time Ta-3 to enable the WCK fast synchronization option. Bit CA4 for the CAS command, which corresponds to the WS_WR option, is low (WS_WR=0) and bit CA5 for the CAS command, which corresponds to the WS_WR option, is low (WS_RD=0) for the rising clock edge of the CK signal at time Ta-3 to not enable both the WCK-CK synchronization with write command option and the WCK-CK synchronization with read command option. The second seven bits CA0-CA6 with WS_FS=1 (from the first seven bits), correspond to WCK-on_OTF, WCKENL_OTF, WRX, and B3.

In contrast to the example of FIG. 9, the WCKon_OTF value in the example of FIG. 11 is used to extend enablement of the WCK and WCKF input buffers of Device0 and Device1 after completion of the access operations. For example, in embodiments where the WCKon_OTF values are defined by the selections shown in FIG. 10B, the WCKon_OTF value may be 01, which corresponds to extending the WCK and WCKF input buffer enable time for two READ or WRITE commands. In embodiments where the WCKon_OTF values are defined by the selections shown in FIG. 10C, the WCKon_OTF value may be 10, which corresponds to extending the WCK and WCKF input buffer enable time for 8 tCK longer than the non-extended case. Other WCKon_OTF values that extend the WCK and WCKF input buffer enable time even more may be used when more access operations are contemplated.

At time Ta6, the select signal CS0 is again active to select the Device0 so that a write command WRITE provided at time Ta6 is received by Device0 for a rising clock edge of the CK signal. With a write latency of 16 tCK, data for the WRITE command at time Ta6 will be provided to Device0 following time Ta22. As previously described. WCK-CK synchronization is performed by Device0 and Device1 between Ta14 and Ta16. In contrast to the example of FIG. 9, the WCK and WCKF input buffers of Device0 are not disabled following the completion of the write operation for the WRITE command from time Ta0 to Device0. Thus, when data for the WRITE command at time Ta6 is provided to Device0, perforating WCK-CK synchronization is unnecessary.

Following time Ta22, the Device0 receives data DQ from the controller 10 within a time tWCK2DQI0 of time Ta22 for the WRITE command at time Ta0 (for Rank0). The data DQ provided to Device0 is synchronized with the WCK and WCKF signals, which have the same WCK-CK synchronization when earlier synchronized between times Ta14-Ta16 by Device0 and Device1.

As illustrated by the example of FIG. 11, the time the WCK and WCKF input buffers are enabled may be extended to avoid repeating WCK-CK synchronization for subsequent access operations. While the WCK and WCKF input buffers are enabled, the WCK-CK synchronization is preserved.

While the embodiments of FIGS. 8, 9, and 11 are described in the context of write operations, it will lie appreciated that the timing commands may be used in the context of read operations without departing from the scope of the disclosure. For example, the CAS command may be used for read operations. Rather than receiving write commands from the controller and receiving data front the controller, Device0 and Device1 receive read commands from the controller and provide data to the controller.

The timing command (e.g., CAS command) disclosed provide flexibility to the timing of performing clock signal synchronization options anti access operations, for example, including single rank access operations to a memory and rank-to-rank access operations to multiple memories. The flexibility provided by the timing command may accommodate different timing scenarios while potentially reducing power consumption from receiving and generating clock signals unnecessary for access operations at that time. For example, unlike typical fast WCK-CK synchronization operations that result in receiving the WCK and WCKF signals and generating internal clock signals earlier than needed for associated access operations, a timing command according to an embodiment of the disclosure may be used to add delay to when the WCK and WCKF signals may be received and when the fast WCK-CK synchronization operation is performed. As a result, the timing command may be used to provide flexible timing.

From the foregoing it will be appreciated that, although specific embodiments of the disclosure have been described herein for purposes of illustration, various modifications may be made without deviating from the spirit and scope of the disclosure. Accordingly, the scope disclosure should not be limited any of the specific embodiments described herein.

What is claimed is:

1. A method, comprising:
   providing a timing command to a memory, the timing command configured to enable a clock signal synchronization option and to set a delay for when an input buffer of the memory is disabled following an access command associated with the timing command when the clock signal synchronization option is enabled;

providing the access command to the memory; and
providing a data clock signal to the input buffer of the memory to be synchronized by the memory.

2. The method of claim 1, further comprising providing a second access command associated with the timing command, wherein the second access command is directed to a second memory.

3. The method of claim 2, further comprising providing a third access command associated with the timing command, wherein the third access command is directed to the memory.

4. The method of claim 1 wherein providing the data clock signal to the memory comprises providing the data clock signal having a static level for a first time and providing the data clock signal having changing clock levels thereafter.

5. The method of claim 1, further comprising providing a clock signal for timing receipt of the timing command and the access command.

6. The method of claim 1 wherein the timing command comprises:
a first part including a clock signal synchronization option field for a value to enable the clock signal synchronization option; and
a second part including an opcode field for a value to set the delay for when the input buffer of the memory is disabled following the access command.

7. A method, comprising:
receiving a timing command configured to enable a clock signal synchronization option and to set a delay for when an input buffer is disabled following an access command associated with the timing command when the clock signal synchronization option is enabled;
receiving the access command;
synchronizing a data clock signal and internal clock signals generated therefrom; and
delaying when the input buffer is disabled based on the delay set by the timing command.

8. The method of claim 7 wherein the timing command is further configured to set a time for when the data clock signal and the internal clock signals are synchronized following the timing command.

9. The method of claim 8, further comprising:
enabling the input buffer to receive the data clock signal;
receiving the data clock signal at the input buffer;
delaying disabling the input buffer following completion of an access operation for the access command according to the set delay.

10. The method of claim 7 wherein the access command comprises a write command, and the method further comprises receiving data associated with the write command at a time defined by a write latency following the access command.

11. The method of claim 7 wherein the access command comprises a read command, and the method further comprises providing data associated with the read command at a time defined by a read latency following the access command.

12. The method of claim 11, further comprising providing a clock signal with the data wherein the clock signal is based on the data clock signal.

13. The method of claim 7 wherein synchronizing the data clock signal comprises determining a phase relationship between the data clock signal and the internal clock signals.

14. The method of claim 7 wherein the clock signal synchronization operation comprises a fast clock signal synchronization operation with the data clock signal.

15. An apparatus, comprising:
a memory configured to receive a timing command and an associated access command, wherein the timing command is configured to enable a clock signal synchronization option and to set a delay for when an input buffer is disabled following the associated access command when the clock signal synchronization option is enabled, wherein responsive to the timing command, the memory configured to synchronize a data clock signal and internal clock signals generated therefrom and further configured to delay when the input buffer is disabled based on a delay set by the timing command.

16. The apparatus of claim 15 wherein the memory comprises a clock signal synchronization circuit configured to synchronize the data clock signal and the internal clock signals generated therefrom.

17. The apparatus of claim 15 wherein the timing command includes an opcode configured to set the delay for when the input buffer is disabled based on a number of access commands or a number of additional clock cycles.

18. An apparatus, comprising:
a controller configured to provide a timing command and an associated access command to a memory, wherein the timing command is configured to enable a clock signal synchronization option and to set a delay for when an input buffer of the memory is disabled following an access command associated with the timing command when the clock signal synchronization option is enabled, the controller further configured to provide a data clock signal to the input buffer of the memory to be synchronized by the memory.

19. The apparatus of claim 18 wherein the controller is configured to provide a second associated access command within the delay for when the input buffer is disabled as set by the timing command.

20. The apparatus of claim 18 wherein the controller is configured to provide write data at a time defined by a write latency following the access command responsive to the access command comprising a write command and wherein the controller is configured to receiving read data at a time defined by a read latency following the access command responsive to the access command comprising a read command.

* * * * *